(12) United States Patent
Takeuchi et al.

(10) Patent No.: US 7,276,994 B2
(45) Date of Patent: *Oct. 2, 2007

(54) PIEZOELECTRIC THIN-FILM RESONATOR, PIEZOELECTRIC FILTER, AND ELECTRONIC COMPONENT INCLUDING THE PIEZOELECTRIC FILTER

(75) Inventors: Masaki Takeuchi, Otsu (JP); Hajime Yamada, Otsu (JP); Hideki Kawamura, Yasu (JP); Daisuke Nakamura, Yasu (JP); Yukio Yoshino, Otsu (JP); Yoshihiko Gotoh, Yasu (JP); Seiichi Arai, Takatsuki (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 100 days.

This patent is subject to a terminal disclaimer.

(21) Appl. No.: 11/004,687

(22) Filed: Dec. 3, 2004

(65) Prior Publication Data

US 2005/0151600 A1    Jul. 14, 2005

Related U.S. Application Data

(63) Continuation-in-part of application No. 10/456,173, filed on Jun. 6, 2003, now Pat. No. 7,002,437.

(30) Foreign Application Priority Data

| May 23, 2002 | (JP) | ............................ 2002-149207 |
| Jun. 11, 2002 | (JP) | ............................ 2002-170321 |
| Apr. 23, 2003 | (JP) | ............................ 2003-117909 |

(51) Int. Cl.
*H03H 9/54* (2006.01)
*H03H 9/15* (2006.01)

(52) U.S. Cl. ........................................ 333/189; 310/346

(58) Field of Classification Search ................ 333/187, 333/189; 310/346

See application file for complete search history.

(56) References Cited

U.S. PATENT DOCUMENTS

| 4,320,365 A | 3/1982 | Black et al. ................. 333/187 |
| 5,692,279 A * | 12/1997 | Mang et al. ................ 29/25.35 |
| 6,081,171 A | 6/2000 | Ella ........................... 333/189 |
| 6,204,737 B1 | 3/2001 | Ella ........................... 333/187 |
| 6,476,536 B1 | 11/2002 | Pensala ....................... 310/312 |
| 6,486,751 B1 | 11/2002 | Barber et al. ................ 333/187 |
| 6,586,861 B2 | 7/2003 | Misu et al. .................. 310/324 |
| 6,734,763 B2 | 5/2004 | Nishihara et al. ............ 333/187 |
| 6,903,496 B2 * | 6/2005 | Takeuchi et al. ............ 310/363 |
| 7,002,437 B2 * | 2/2006 | Takeuchi et al. ............ 333/187 |
| 2002/0140520 A1* | 10/2002 | Hikita et al. ................ 333/133 |
| 2003/0042992 A1* | 3/2003 | Frank ........................... 333/26 |
| 2003/0128081 A1* | 7/2003 | Ella et al. .................... 333/133 |

(Continued)

FOREIGN PATENT DOCUMENTS

JP       58-121817       7/1983

(Continued)

*Primary Examiner*—Barbara Summons
(74) *Attorney, Agent, or Firm*—Keating & Bennett, LLP

(57) ABSTRACT

A piezoelectric thin-film resonator includes a supporting substrate. A piezoelectric thin-film is formed on the supporting substrate. A lower electrode and an upper electrode are formed with the piezoelectric thin-film therebetween. The stiffness of at least one of the lower and upper electrodes is higher than that of the piezoelectric thin-film.

32 Claims, 17 Drawing Sheets

U.S. PATENT DOCUMENTS

| | | | |
|---|---|---|---|
| 2003/0179053 A1* | 9/2003 | Aigner et al. | 333/189 |
| 2004/0140868 A1 | 7/2004 | Takeuchi et al. | 333/189 |

FOREIGN PATENT DOCUMENTS

| | | |
|---|---|---|
| JP | 58-137317 | 8/1983 |
| JP | 2000-69594 | 3/2000 |
| JP | 2001-156582 | 6/2001 |
| JP | 2001-168674 | 6/2001 |
| JP | 2001-274650 | 10/2001 |
| JP | 2003-347889 | 5/2003 |

\* cited by examiner

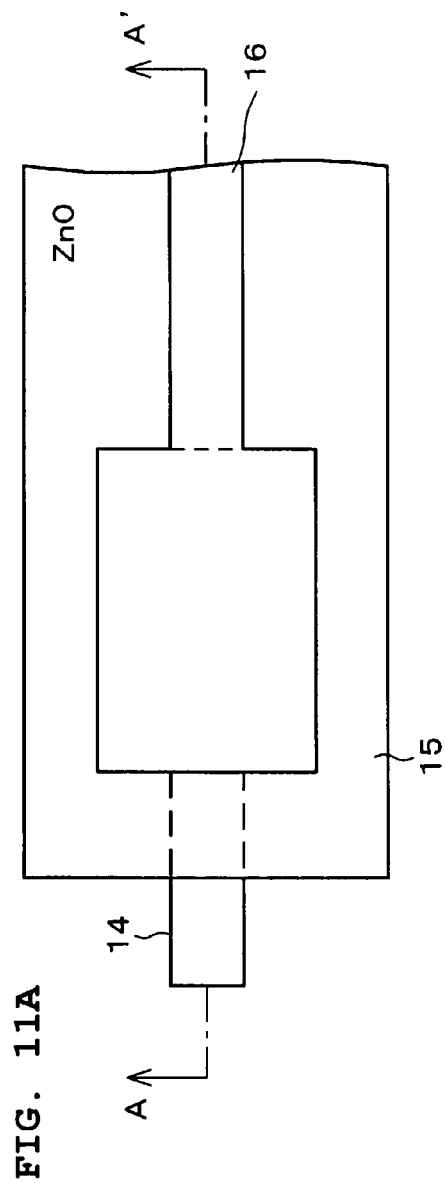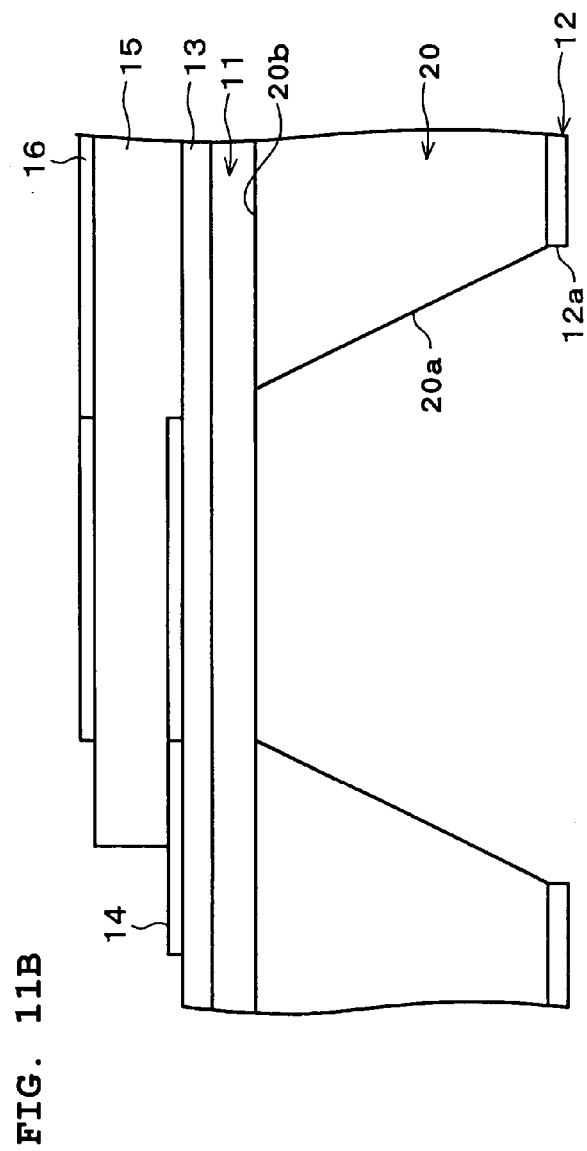
FIG. 11A
FIG. 11B

PIEZOELECTRIC THIN-FILM RESONATOR, PIEZOELECTRIC FILTER, AND ELECTRONIC COMPONENT INCLUDING THE PIEZOELECTRIC FILTER This application is a Continuation-in-Part of U.S. patent application Ser. No. 10/456,173, filed on Jun. 6, 2003, now U.S. Pat. No. 7,002,437.

BACKGROUND OF THE INVENTION

1. Field of the Invention

The present invention relates to a piezoelectric thin-film resonator used for filters in a high-frequency band (RF band, particularly, GHz band or more) of communication apparatuses, such as mobile phones. The present invention also relates to a piezoelectric filter including the resonator and an electronic component including the piezoelectric filter, such as a duplexer.

2. Description of the Related Art

In recent years, filters used in a high-frequency band (RF band, particularly, GHz band or more) for use in communication apparatuses, such as mobile phones, have been developed by using piezoelectric resonators that are small, lightweight, and highly resistant to vibration and shock. Furthermore, variations in products are small, highly reliable, and circuits need not be adjusted. Thus, mounting can be automated and simplified. In addition, a piezoelectric resonator having a high frequency can be easily manufactured.

The above-described piezoelectric resonator includes a piezoelectric substrate and electrodes provided on both principal surfaces thereof. The piezoelectric resonator operates in a thickness-longitudinal vibration mode or a thickness-shear vibration mode. The resonance frequency of the piezoelectric resonator in the thickness-longitudinal vibration mode of the piezoelectric substrate is inversely proportional to the thickness of the piezoelectric substrate, and thus the piezoelectric substrate must be extremely thin for a use in an ultra high-frequency region.

However, the thickness of the piezoelectric substrate can be reduced only within limits of mechanical strength and handling, and a practical high-frequency limit is several hundred MHz in a fundamental mode. In order to overcome such a problem, the usage of a piezoelectric thin-film resonator has been proposed for use in filters and resonators (for example, reference 1: Japanese Unexamined Patent Application Publication No. 2001-168674, published on Jun. 22, 2001).

In this piezoelectric thin-film resonator, a thin-film supporting portion can be thinned by using micromachining techniques, and a thin piezoelectric thin-film can be formed by sputtering or the like. Thus, a high-frequency characteristic of several hundred to several thousand MHz can be achieved.

Also, a piezoelectric resonator which includes an $SiO_2$ thin-film having a positive resonance-frequency temperature characteristic has been proposed so as to improve the temperature characteristic of the resonance frequency (reference 2: Japanese Unexamined Patent Application Publication No. 58-121817, published on Jul. 20, 1983 and reference 3: Japanese Unexamined Patent Application Publication No. 58-137317, published on Aug. 15, 1983).

Also, a piezoelectric resonator including a lower electrode, a piezoelectric layer including AlN, and an upper electrode has been proposed in order to increase Q of the piezoelectric resonator (reference 4: Japanese Unexamined Patent Application Publication No. 2000-69594, published on Mar. 3, 2000). In this piezoelectric resonator, the electrodes include Mo, which has a low thermoelesticity loss.

Further, in a piezoelectric resonator shown in reference 5 (Japanese Unexamined Patent Application Publication No. 2001-156582, published on Jun. 8, 2001), an electrode includes two layers of Pt and Al in order to reduce the ratio of Pt in the electrode. Also, Al having a low resistivity is used. With this configuration, by reducing the ratio of Pt in the electrode in order to reduce the mass additional effect and by increasing the ratio of Al having a low resistivity in order to reduce the resistance of the entire electrode, the resonance frequency can be improved and the Q of the piezoelectric resonator can be increased.

However, in the piezoelectric resonator according to reference 5, the filter characteristics widely vary and high manufacturing precision is required, which leads to an increase in the manufacturing cost.

Also, as in references 2 and 3, when a $SiO_2$ thin-film is used to improve the temperature characteristic, Q of the piezoelectric resonator decreases because the stiffness of $SiO_2$ is low.

On the other hand, because the piezoelectric resonator shown in reference 4 includes Mo and AlN, the temperature coefficient of frequency (TFC) is unfavorable and the TFC cannot be adjusted.

U.S. Pat. No. 6,323,744 (publication date: Nov. 27, 2001) discloses a filter circuit using a piezoelectric resonator. The filter circuit is a ladder filter having parallel resonators and series resonators. Each of the parallel resonators has a top ground (GND) electrode, a lower electrode, and a path for connecting the top GND electrode to an individual external GND.

Moreover, Japanese Unexamined Patent Application Publication No. 2000-269780 (publication date: Sep. 29, 2000) discloses a balanced multiple-mode piezoelectric filter having four electrodes arranged in a 2 by 2 matrix. In the filter, two of the electrodes which are aligned in the same column are paired and one electrode of the pair functions as an input side and the other electrode functions as an output side.

The filter disclosed in U.S. Pat. No. 6,323,744 has a problem in that, because input and output terminals are unbalanced terminals, the filter is not applicable to an electronic component, such as an integrated circuit, having balanced input and output terminals, which are becoming the mainstream.

In the filter disclosed in Japanese Unexamined Patent Application Publication No. 2000-269780, two standing waves, a first symmetric resonant mode and a first antisymmetric resonant mode, are acoustically coupled. Electric signals input from an input end are acoustically transformed, propagate to an output end, and are transformed into electric signals at the output end. Therefore, acoustic transformation is performed twice, so that transformation energy loss is increased and insertion loss is thus increased.

SUMMARY OF THE INVENTION

In order to solve the above described problems, the present invention provides a piezoelectric filter including a substrate and a plurality of piezoelectric resonators. At least one of the plurality of piezoelectric resonators includes a piezoelectric thin-film disposed on the substrate, a first electrode and a second electrode facing each other with the piezoelectric thin-film therebetween, and a base electrode provided under each of the first and second electrodes. A stiffness of at least one of the first and second electrodes is higher than a stiffness of the piezoelectric thin-film. Each of the base electrodes has an adhesion strength that is greater than an adhesion strength of the first and second electrodes.

The piezoelectric filter further may include a balanced-to-unbalanced transforming unit selected from the group consisting of a double-mode filter, an induction coil, a lattice filter, a balun, and a transversal surface-acoustic-wave filter.

Preferably, a vibrating portion of the piezoelectric thin-film is disposed directly above a hollow portion and lies adjacent to the substrate. The hollow portion may be one of an opening and a cavity in the substrate.

At least one of the piezoelectric resonators may include an insulating layer formed on a surface thereof. The insulating layer may include a plurality of thin insulating sublayers having different temperature coefficients. The insulating layer may include a plurality of structures whose internal stresses have different inducing mechanisms.

Preferably, the plurality of piezoelectric resonators is arranged in a ladder configuration. Alternatively, the plurality of piezoelectric resonators is preferably arranged in a lattice configuration.

The piezoelectric filter may include a balanced-to-unbalanced transforming unit.

Another preferred embodiment of the present invention also provides an electronic component including the above described piezoelectric filter.

A further preferred embodiment of the present invention provides a piezoelectric filter including a substrate and a plurality of piezoelectric resonators. At least one of the plurality of piezoelectric resonators includes a piezoelectric thin-film disposed on the substrate and a first electrode and a second electrode facing each other with the piezoelectric thin-film therebetween. A stiffness of at least one of the first and second electrodes is higher than a stiffness of the piezoelectric thin-film. A difference between a lattice constant of the piezoelectric thin-film in a direction vertical to a vibration direction of the at least one of the plurality of piezoelectric resonators and a lattice constant of a material of one of the first and second electrodes in the direction vertical to the vibration direction is about 5% or less.

The piezoelectric filter may include a balanced-to-unbalanced transforming unit selected from the group consisting of a double-mode filter, an induction coil, a lattice filter, a balun, and a transversal surface-acoustic-wave filter.

Preferably, a vibrating portion of the piezoelectric thin-film is disposed directly above a hollow portion and lies adjacent to the substrate. The hollow portion may be one of an opening and a cavity in the substrate.

The piezoelectric resonator may include an insulating layer formed on a surface thereof. The insulating layer may include a plurality of thin insulating sublayers having different temperature coefficients. The insulating layer may include a plurality of structures whose internal stresses have different inducing mechanisms.

Preferably, the plurality of piezoelectric resonators is arranged in a ladder configuration. Alternatively, the plurality of piezoelectric resonators is preferably arranged in a lattice configuration.

The piezoelectric filter may include a balanced-to-unbalanced transforming unit.

Another preferred embodiment of the present invention provides an electronic component including the above described piezoelectric filter.

Other features, elements, characteristics, and advantages of the present invention will become more apparent from the following detailed description of preferred embodiments thereof with reference to the attached drawings.

BRIEF DESCRIPTION OF THE DRAWINGS

FIGS. 9A and 9B show modifications of the ladder filter in which FIG. 9A shows a t-type and FIG. 9B shows a π-type;

FIG. 11A is a top plan view of a ladder filter of the piezoelectric filter according to a third preferred embodiment of the present invention;

FIG. 11B is a cross-sectional view taken along line A–A' of FIG. 11A;

DETAILED DESCRIPTION OF PREFERRED EMBODIMENTS

Hereinafter, preferred embodiments of the present invention including a piezoelectric thin-film resonator, a piezoelectric filter including the resonator, and a duplexer defining an electronic component including the filter of various other preferred embodiments of the present invention will be described with reference to FIGS. 1 to 19.

First Preferred Embodiment

Figure 1:
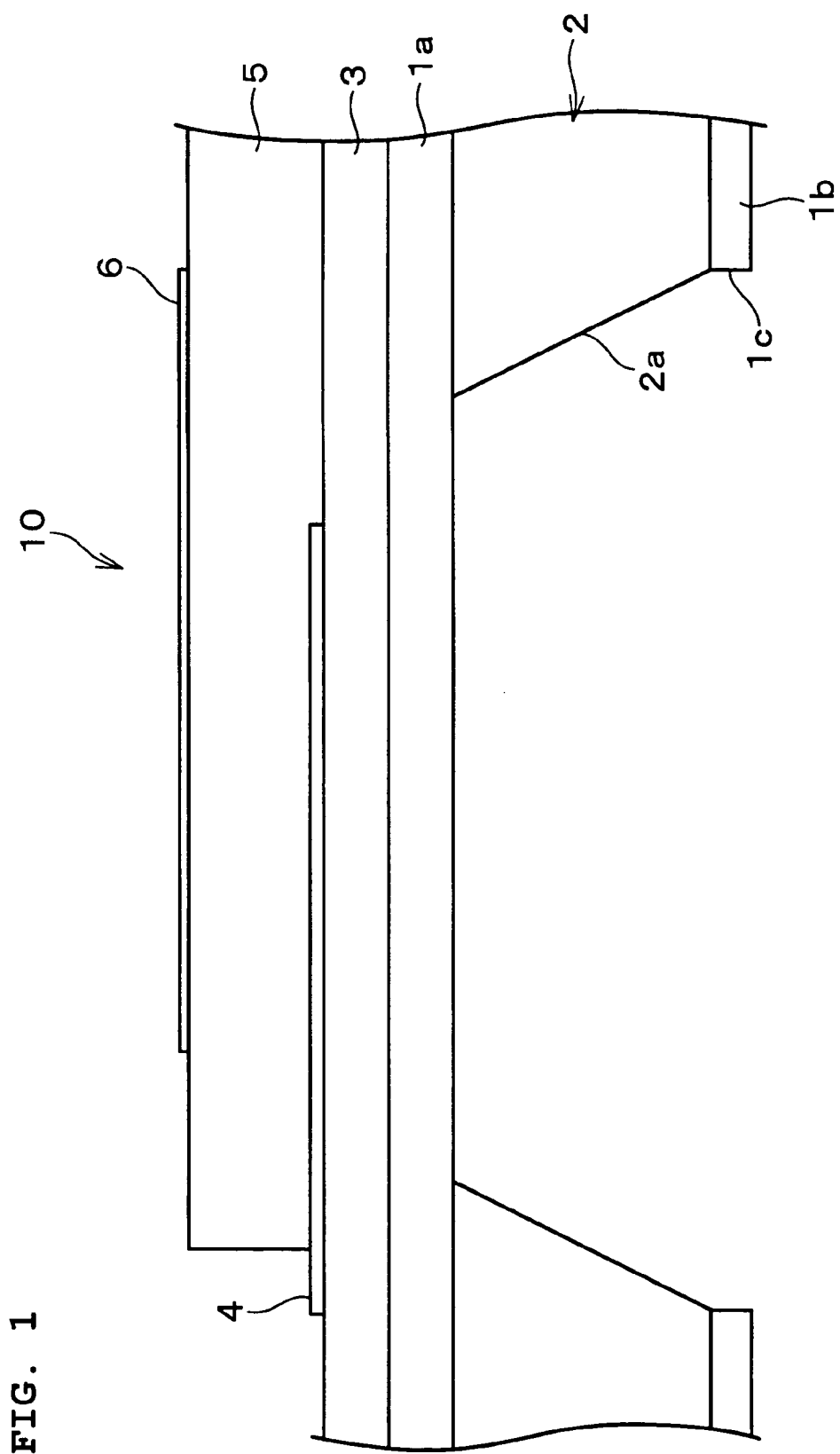
FIG. 1 is a cross-sectional view showing the configuration of a piezoelectric thin-film resonator according to a first preferred embodiment of the present invention.

A method of manufacturing a piezoelectric thin-film resonator 10 according to the first preferred embodiment of the present invention will be described with reference to FIG. 1.

First, silicon dioxide ($SiO_2$) films 1a and 1b serving as insulating films are formed on both principal surfaces of a supporting substrate 2, which includes (100)-oriented silicon, by thermal oxidation or sputtering. Then, a substantially rectangular window 1c, which has an edge that is substantially parallel to the (110)-direction, is formed in the $SiO_2$ film 1b on the rear surface of the supporting substrate 2. By using the $SiO_2$ film 1b having the window 1c as a mask, the silicon of the supporting substrate 2 is etched in a tetramethyl ammonium hydroxide (TMAH) solution under a temperature of about 90° C.

In the TMAH, the etching rate greatly depends on crystal orientation. Thus, as the etching process proceeds, a (111)-plane 2a, which forms an angle of about 55° with respect to a (100)-plane in the direction of the surface of the supporting substrate 2, is formed, so that an opening which extends through the supporting substrate 2 in the thickness direction is formed.

The etching process is completely stopped at the $SiO_2$ film 1a on the front surface of the supporting substrate 2. Accordingly, a smooth resonator surface can be obtained and the thickness of the entire resonator is set precisely.

Then, an alumina ($Al_2O_3$) film 3, serving as an insulating film, is formed on the $SiO_2$ film 1a by vacuum evaporation or sputtering, so that a diaphragm including the $SiO_2$ film 1a and the $Al_2O_3$ film 3 is formed. With this configuration, the diaphragm faces the opening (hollow portion) defined by the (111)-plane 2a of the supporting substrate 2.

In the above-described diaphragm, the $SiO_2$ film 1a has a positive resonance-frequency temperature characteristic and generates compressive stress. The $Al_2O_3$ film 3 has a negative resonance-frequency temperature characteristic and generates tensile stress.

Then, a lower electrode (first electrode) 4 including Al, a piezoelectric thin-film 5 mainly including zinc oxide (ZnO), and an upper electrode (second electrode) 6 including Ni, are formed in that order on the diaphragm by vacuum evaporation or sputtering and etching. Accordingly, the piezoelectric thin-film resonator 10 is obtained. The piezoelectric thin-film 5 has a negative resonance-frequency temperature characteristic and generates compressive stress.

In the piezoelectric thin-film resonator 10, the resonance frequency depends on the thickness of the entire vibrating portion including the insulating layer having the $SiO_2$ film 1a and the $Al_2O_3$ film 3, the lower electrode 4, the piezoelectric thin-film 5, and the upper electrode 6.

Also, in the piezoelectric thin-film resonator 10, the total thickness of the $SiO_2$ film 1a, the $Al_2O_3$ film 3, the lower electrode 4, the piezoelectric thin-film 5, and the upper electrode 6 are preferably about 3 μm, and the area of the diaphragm (vibrating portion) is preferably about 600 μm×600 μm.

Further, the resonance frequency of the piezoelectric thin-film resonator 10 can be changed by changing the position of the piezoelectric thin-film resonator 10 and by changing the size and thickness of the lower and upper electrodes.

In the piezoelectric thin-film resonator 10, the thickness of the $SiO_2$ film 1a and the $Al_2O_3$ film 3, the area of the lower electrode 4 and the upper electrode 6, and the thickness of the piezoelectric thin-film 5 are preferably set so that the piezoelectric thin-film resonator 10 vibrates in a secondary vibration mode. Accordingly, in the piezoelectric thin-film resonator 10, the temperature coefficient (ppm/° C.) of the resonance frequency can be easily set to almost zero.

Further, in the piezoelectric thin-film resonator 10, the total thickness of the $SiO_2$ film 1a and the $Al_2O_3$ film 3 and the total thickness of the piezoelectric thin-film 5, the lower electrode 4, and the upper electrode 6 are preferably set so that the resonator 10 resonates at a half-wavelength of a desired resonance frequency. That is, the thickness of at least one of the lower electrode 4 and the upper electrode 6 is preferably set in accordance with the desired resonance frequency. With this arrangement, the vibration mode of the piezoelectric thin-film resonator 10 can reliably be the secondary mode.

More preferably, in the piezoelectric thin-film resonator 10, the lower electrode 4, the piezoelectric thin-film 5, and the upper electrode 6 are arranged so that the piezoelectric thin-film resonator 10 traps energy therein. Accordingly, vibration energy does not leak out into the supporting substrate 2 along the diaphragm, and thus high-Q resonance is generated.

In this way, the piezoelectric thin-film resonator 10, the $SiO_2$ film 1a and the $Al_2O_3$ film 3, serving as insulating films (supporting films) can be extremely thin. Therefore, a piezoelectric thin-film resonator which operates in a fundamental mode or at a low overtone (for example, secondary mode) at a high-frequency of 100 MHz or more is obtained. Further, in the piezoelectric thin-film resonator 10, the temperature characteristic and inner stress of each film offset each other, and thus the bad effects of variations in temperature and internal stress are prevented.

Also, the dimensions of the diaphragm of the piezoelectric thin-film resonator are very small, for example, several hundred μm or less, and the manufacturing process thereof is compatible with the manufacturing processes of semiconductor integrated circuits. Thus, the resonator can be incorporated into an integrated circuit. Further, in the piezoelectric thin-film resonator 10, submicron patterning, which is required in surface acoustic wave (SAW) devices, is not required, even at several GHz, and thus the manufacturing method is simplified.

In the piezoelectric thin-film resonator 10, the diaphragm faces the opening. However, the diaphragm does not deteriorate the Q of vibration and may be in contact with a gas such as air. Therefore, the diaphragm may face a recessed portion provided in the supporting substrate 2 or a gap formed between the diaphragm and the supporting substrate 2. Alternatively, the piezoelectric thin-film resonator 10 may have a cantilever structure or an overhang structure.

Preferably, the piezoelectric thin-film resonator 10 includes the electrodes including Ni and Al, the piezoelectric thin-film including ZnO, and the films forming the diaphragm including $Al_2O_3$ and $SiO_2$, and preferably vibrates in a thickness-longitudinal vibration mode. Alternatively, the piezoelectric thin-film may include AlN, PZT, or CdS, and the diaphragm may include SiN. Further, the vibration mode may be a thickness-shear vibration mode, an extensional vibration mode, or a flexion vibration mode.

The upper electrode 6 may include Ta, Nb, Mo, Pt, W, stainless alloy, Al alloy, Al with additives (for example, Cu, Mg, Si, and Zn), or a constant elastic material such as elinvar. The elinvar is an Fe—Ni—Cr alloy, and the expansion coefficient thereof can be controlled by heat-treating the alloy at the vicinity of the magnetic-phase transition point.

Also, the upper electrode 6 is formed so that the stiffness thereof in a direction that is substantially parallel to the excitation direction of a vibration wave (polarization direction) of the piezoelectric thin-film 5 is higher than the stiffness in the same direction of the piezoelectric thin-film 5. That is, the stiffness of the upper electrode 6 is preferably about $2.3 \times 10^{11}$ Pa or more when the piezoelectric thin-film 5 includes ZnO.

The lower electrode 4 may include the same material as that for the upper electrode 6 so as to obtain the equivalent effects. Preferably, the difference between the lattice constant in the direction vertical to the vibration direction of the piezoelectric thin-film 5 (in this case ZnO) and the lattice constant in the direction vertical to the vibration direction of the material for the electrode is about 5% or less. In this case, the crystallinity of the piezoelectric thin-film 5 formed on the lower electrode 4 is improved, and thus the piezoelectric characteristics are further improved.

Figure 2:
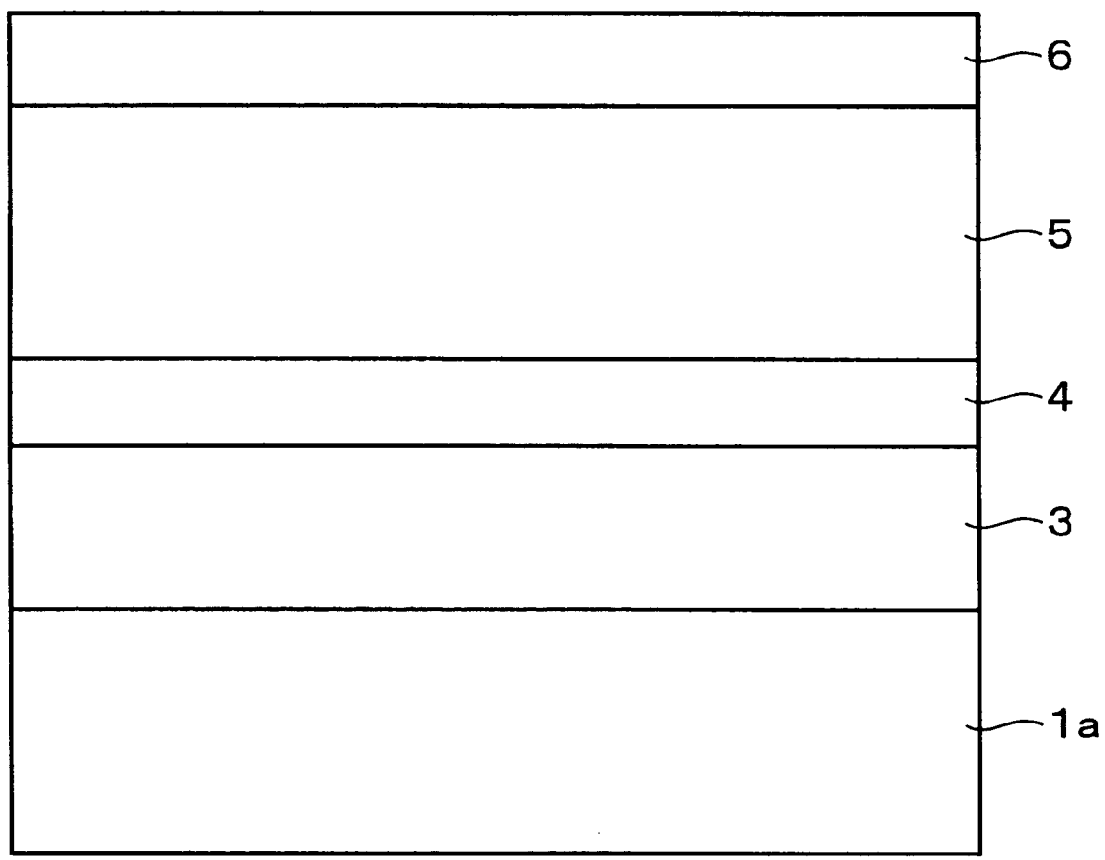
FIG. 2 is an enlarged view showing a portion of the piezoelectric thin-film resonator.

Now, various examples in which various types of metal are used for the upper electrode 6 will be described. First, as shown in FIG. 2, each layer of the piezoelectric thin-film resonator was formed. Examples of a metallic material for the upper electrode 6 are shown in Table 1. The upper electrode 6 has a thickness of about 0.18 μm. The piezoelectric thin-film 5 including ZnO has a thickness of about 1.25 μm, the lower electrode 4 including Al has a thickness of about 0.18 μm, the $Al_2O_3$ film 3 has a thickness of about 0.45 μm, and the $SiO_2$ film 1a has a thickness of about 1.2 μm.

Table 1 shows the characteristics of the resonator, which change in accordance with the material used for the upper electrode 6. As can be seen in Table 1, Q and $k^2$ are higher when Mo, Ni, Nb, or Ta, having a stiffness that is higher than that of the piezoelectric thin-film 5, are used for the upper electrode 6, when compared to the case where Al, having a stiffness that is lower than that of the piezoelectric thin-film 5, is used for the upper electrode 6. This is because the piezoelectric thin-film resonator easily vibrates by using a high-stiffness material and that the vibration energy loss of the piezoelectric thin-film resonator is reduced.

The stiffness $C_{11}^D$ of Pt is high, about $3.47 \times 10^{11}$ Pa. Therefore, when Pt is used for the upper electrode 6, high Q and $k^2$ can be obtained as when Mo, Ni, Nb, or Ta is used.

TABLE 1

|  | Mo | Ni | Nb | Ta | Al |
|---|---|---|---|---|---|
| Stiffness $C_{11}^D$ | 4.63 | 2.51 | 2.46 | 2.61 | 1.07 |
| Q | 2032 | 2037 | 2041 | 2037 | 1320 |
| $k^2$ (%) | 3.87 | 3.86 | 3.86 | 3.86 | 3.81 |

In Table 1, the unit of stiffness $C_{11}^D$ is $\times 10^{11}$ Pa, and the resonance frequency was between about 1800 MHz and about 2000 MHz. The stiffness of the other materials was as follows: the stiffness $C_{11}^D$ of $SiO_2$ was $0.785 \times 10^{11}$ Pa; the stiffness $C_{11}^D$ of $Al_2O_3$ was $3.746 \times 10^{11}$ Pa; the stiffness $C_{11}^D$ of AlN was $4.15 \times 10^{11}$ Pa; and the stiffness $C_{33}^D$ of ZnO was $2.299 \times 10^{11}$ Pa.

Figure 3:
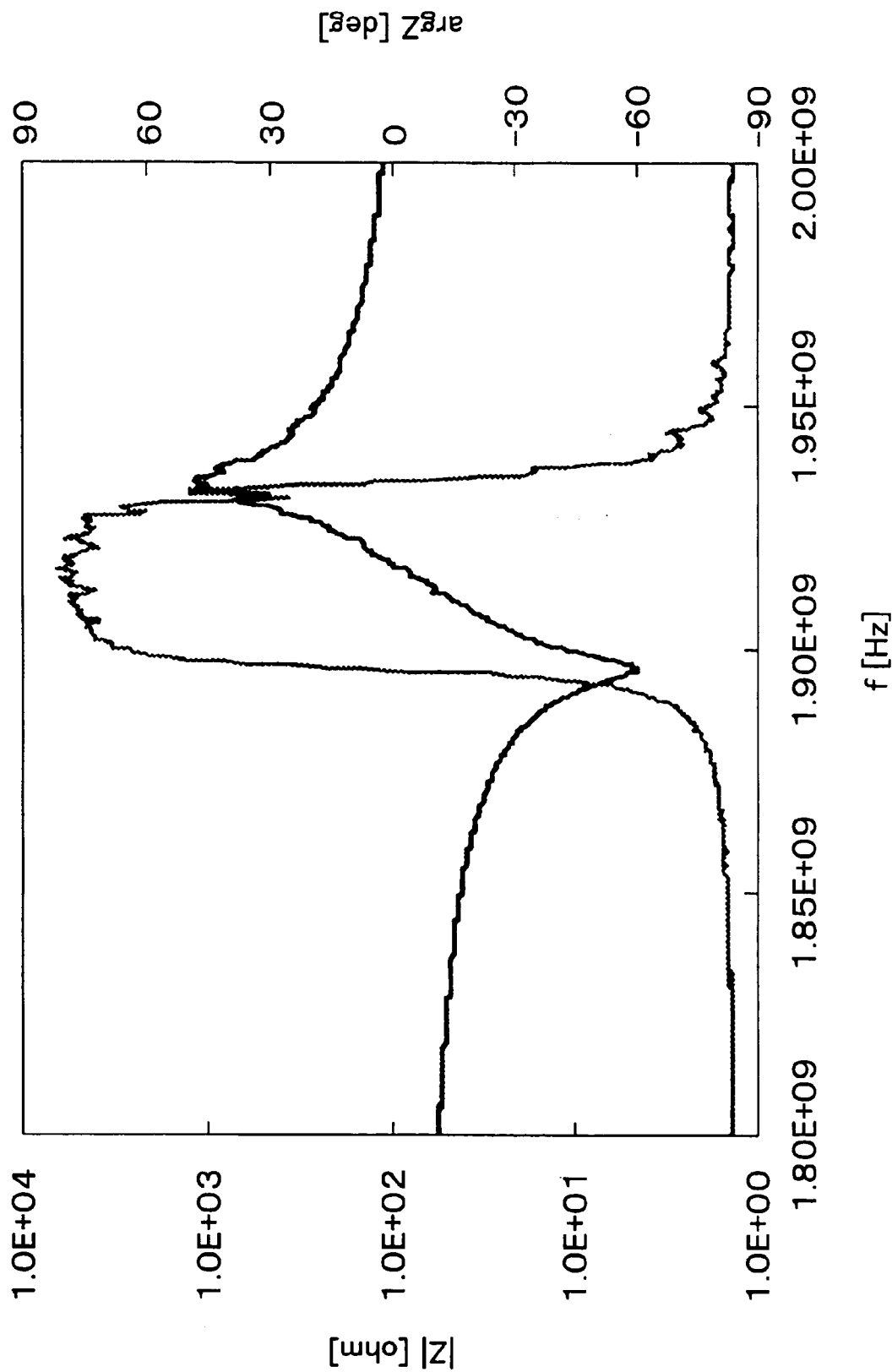
FIG. 3 shows the filter characteristics of a piezoelectric thin-film resonator of a comparative example in which Al is used for an upper electrode.

Hereinafter, various examples in which the material and thickness of the upper electrode 6 are changed will be discussed. For comparison, the configuration and the thickness of each film of the piezoelectric thin-film resonator were set as follows: $Al/ZnO/Al/Al_2O_3/SiO_2 = 0.16/1.27/0.17/0.46/1.21$ (μm). The filter characteristics in this case are shown in FIG. 3 and Table 2.

Figure 4:
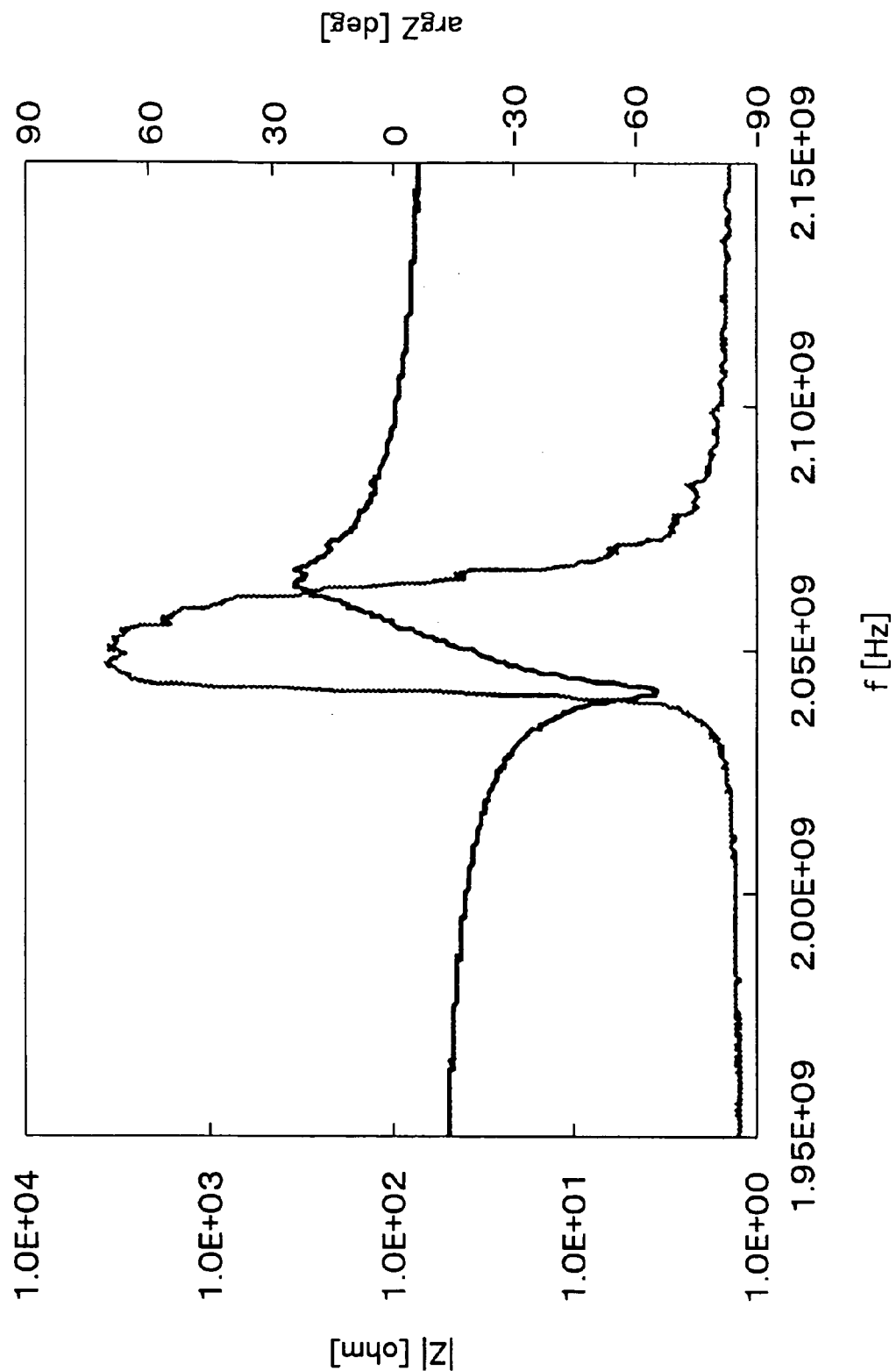
FIG. 4 shows the filter characteristics of the piezoelectric thin-film resonator of the first preferred embodiment of the present invention in which Ni is used for an upper electrode.

In a first example, the configuration and the thickness of each film of the piezoelectric thin-film resonator in accordance with the first preferred embodiment of the present invention were set as follows: $Ni/ZnO/Al/Al_2O_3/SiO_2 = 0.14/1.08/0.17/0.40/1.20$ (μm). The filter characteristics in this case are shown in FIG. 4 and Table 2.

Figure 5:
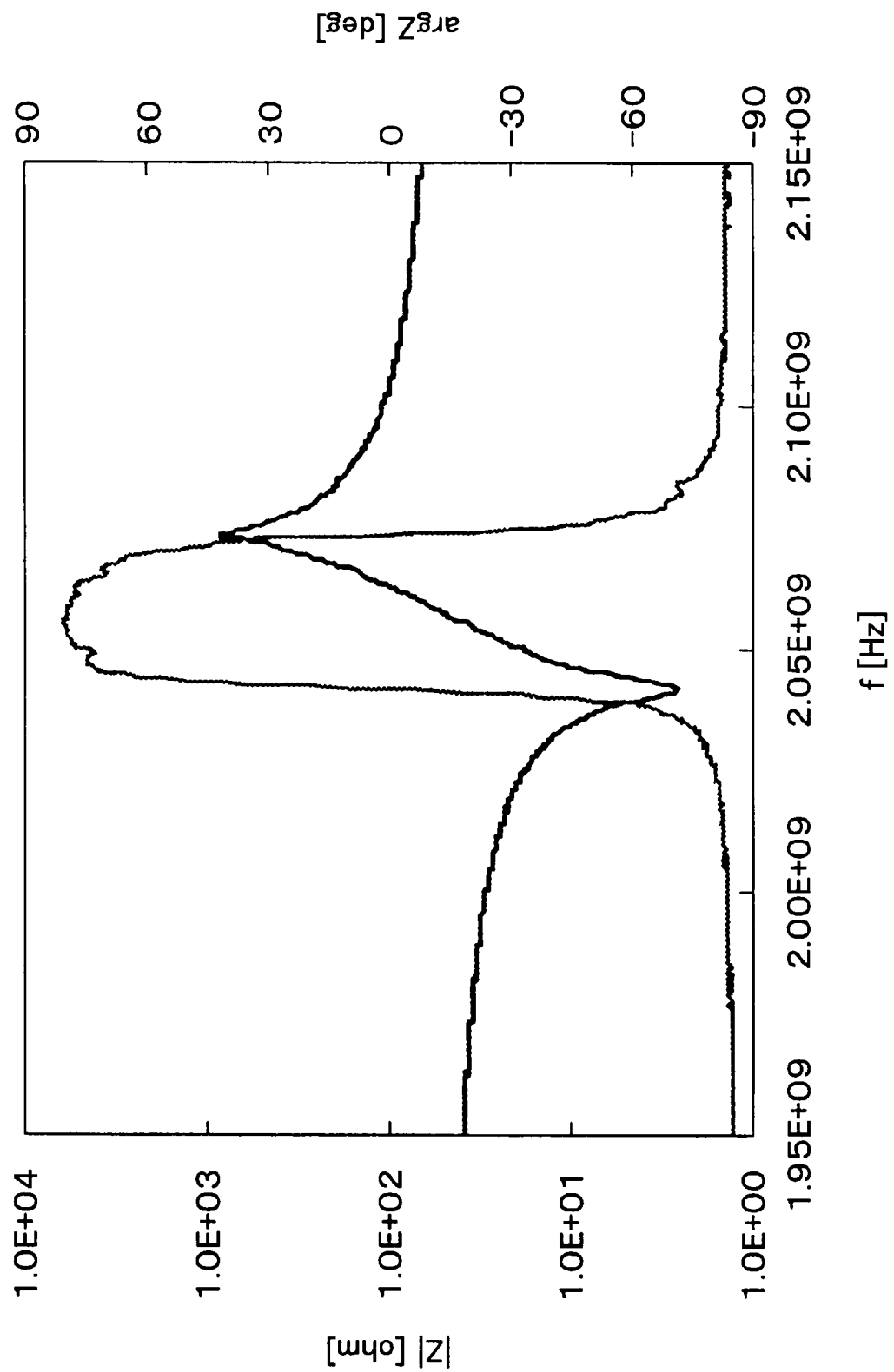
FIG. 5 shows the filter characteristics of the piezoelectric thin-film resonator of the first preferred embodiment of the present invention in which Pt is used for the upper electrode.

In a second example, the configuration and the thickness of each film of the piezoelectric thin-film resonator in accordance with the first preferred embodiment of the present invention were set as follows: $Pt/ZnO/Al/Al_2O_3/SiO_2 = 0.1/0.98/0.17/0.40/1.21$ (μm). The filter characteristics in this case are shown in FIG. 5 and Table 2.

Figure 6:
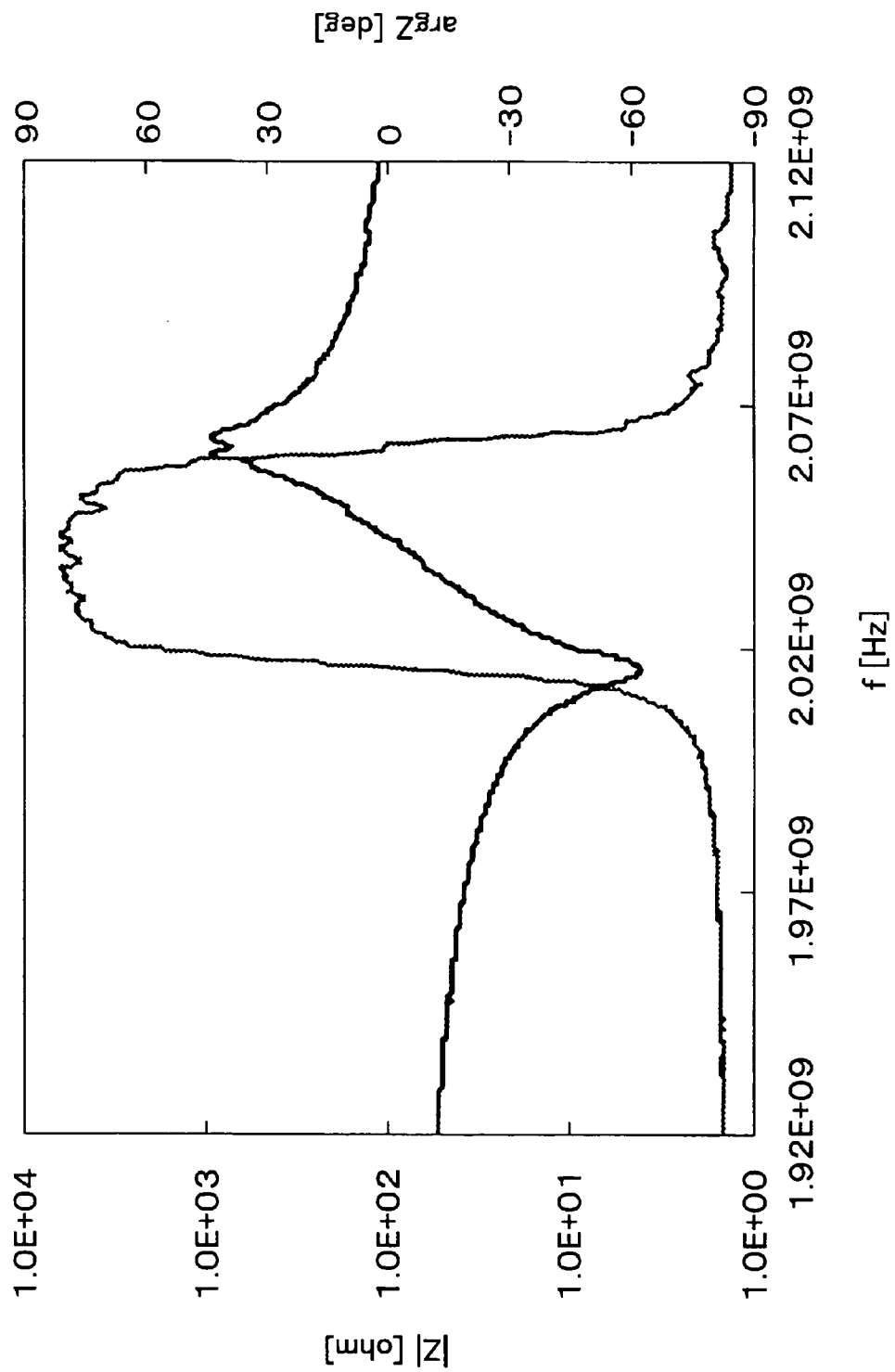
FIG. 6 shows the filter characteristics of the piezoelectric thin-film resonator of the first preferred embodiment of the present invention in which Mo is used for the upper electrode.

In a third example, the configuration and the thickness of each film of the piezoelectric thin-film resonator in accordance with the first preferred embodiment of the present invention were set as follows: $Mo/ZnO/Al/Al_2O_3/SiO_2 = 0.14/1.09/0.17/0.40/1.23$ (μm). The filter characteristics in this case are shown in FIG. 6 and Table 2.

TABLE 2

| Material of electrode | Q (—) | $K^2$ (%) | $Q \times k^2$ | Resonance resistance (Ω) | Antiresonance resistance (Ω) |
|---|---|---|---|---|---|
| Ni | 950 | 2.4 | 2280 | 3.4 | 450 |
| Pt | 710 | 3.1 | 2160 | 2.7 | 633 |
| Mo | 400 | 4.5 | 1810 | 4.3 | 850 |
| Ta | 170 | 4.6 | 760 | 13.0 | 920 |
| Al | 450 | 4.1 | 1830 | 4.5 | 1180 |

As can be seen in Tables 1 and 2, Ni is a preferable material for the upper electrode 6.

Further, because Al is used for the lower electrode 4, the difference between the lattice constant in the direction vertical to the vibration direction of the piezoelectric thin-film 5 and the lattice constant in the direction vertical to the vibration direction of the material for the electrode is about 2%. Accordingly, preferable crystallinity and piezoelectric characteristics of a ZnO film on the Al film are obtained. Therefore, preferable resonance characteristics are also obtained.

The same effect can be obtained when Pt is used instead of Al. Because the difference between the lattice constant of Pt and that of ZnO is small and Pt is resistant to oxidization, a ZnO film having a good crystallinity is obtained. Therefore, Pt is preferably used for the lower electrode 4.

In this preferred embodiment, the temperature coefficient of frequency (TCF) is adjusted by using $SiO_2$. However, because the stiffness of $SiO_2$ is low, the initial characteristics are deteriorated. However, because the stiffness of the electrode is higher than $SiO_2$, the Q is improved. Accordingly, in this preferred embodiment, a piezoelectric resonator having low TCF and high Q is manufactured.

Second Preferred Embodiment

Figure 7:
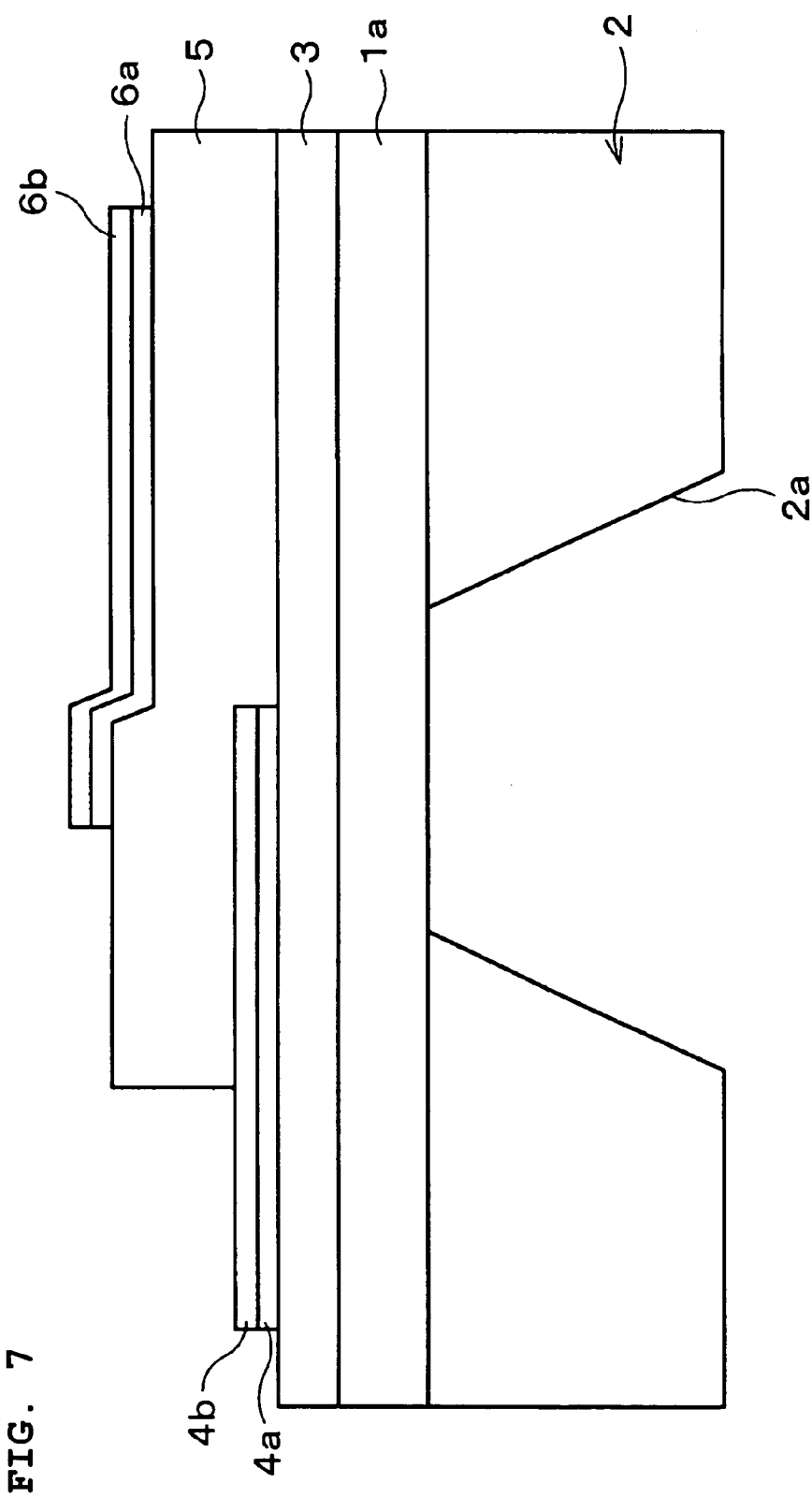
FIG. 7 is a cross-sectional view showing the configuration of a piezoelectric thin-film resonator according to a second preferred embodiment of the present invention.

FIG. 7 is a cross-sectional view showing the configuration of a piezoelectric thin-film resonator according to a second preferred embodiment of the present invention. This piezoelectric thin-film resonator has almost the same configuration as that of the piezoelectric thin-film resonator of the first preferred embodiment of the present invention.

Specifically, the piezoelectric thin-film resonator according to the second preferred embodiment preferably includes a supporting substrate 2 including silicon, an opening (hollow portion) 2a being provided therein. Also, an SiO$_2$ film 1a and an AlN film 3, serving as insulating films (supporting films), are formed on the supporting substrate 2 so as to form a diaphragm. Preferably, a base electrode 4a including Ti, a lower electrode (first electrode) 4b including Pt, a piezoelectric thin-film 5 mainly including ZnO, a base electrode 6a including Ti, and an upper electrode (second electrode) 6b including Pt are formed in order on the diaphragm.

In the piezoelectric thin-film resonator according to the second preferred embodiment, the base electrodes 4a and 6a including Ti are provided under the lower electrode 4b and the upper electrode 6b, respectively. The Ti of the base electrodes 4a and 6a is preferentially oriented in the (001) plane. The effect of the base electrodes, which will be described later, can be obtained if the base electrode is provided under only one of the lower electrode 4b and the upper electrode 6b.

As described above, the stiffness of Pt used for the lower electrode 4b and the upper electrode 6b is higher than that of the piezoelectric thin-film 5, and thus Pt is a preferable material for the electrodes. However, because the adhesion strength of Pt is low, the lower electrode 4b and the upper electrode 6b may be separated from the substrate 2, the insulating AlN film 3, and the piezoelectric thin-film 5.

In order to overcome such a problem, in the second preferred embodiment, the base electrodes 4a and 6a are provided under the lower electrode 4b and the upper electrode 6b, respectively. Further, the base electrodes 4a and 6a preferably includes Ti, which strongly adheres to the substrate 2 the insulating AlN film 3, and the piezoelectric thin-film 5, and thus the lower electrode 4b and the upper electrode 6b are not peeled off. The base electrodes 4a and 6a may include Cr or NiCr instead of Ti.

In this preferred embodiment, Pt is preferably used for both the lower electrode 4b and the upper electrode 6b. Alternatively, as described in the first preferred embodiment, at least one of the lower electrode 4b and the upper electrode 6b may include a material whose stiffness is higher than that of the piezoelectric thin-film 5, for example, Ni, Ta, Nb, Mo, W, stainless alloy, Al alloy, Al with additives (for example, Cu, Mg, Si, and Zn), or elinvar. Because the stiffness of these materials is higher than that of the piezoelectric thin-film 5, a piezoelectric resonator of high Q and high $k^2$ can be obtained.

Alternatively, one of the lower electrode 4b and the upper electrode 6b may include Ir, Ni, Au, Cu, or Mo, whose acoustic impedance in the propagation direction of an elastic wave is larger than the acoustic impedance in the propagation direction of an elastic wave of ZnO or AlN of the piezoelectric thin-film 5.

By using these materials, an elastic wave is reflected at the interface between these films and the piezoelectric thin-film 5, energy is easily trapped in the piezoelectric thin-film 5, and thus the resonance characteristics are further improved.

Each of Ir, Ni, Au, Cu, and Mo has either low adhesion strength or large stress. Thus, as in the case where Pt is used, the lower electrode 4b and the upper electrode 6b may be separated from the substrate 2, the insulating film, or the piezoelectric thin-film 5.

However, as in the above-described preferred embodiment of the present invention, by providing the base electrodes 4a and 6a under the lower electrode 4b and the upper electrode 6b and by using Ti, Cr, or NiCr having a high adhesion strength for the base electrodes 4a and 6a, the electrodes can be prevented from being peeled off. Thus, a piezoelectric thin-film resonator having preferable characteristics is obtained.

Also, in the second preferred embodiment, Ti of the base electrodes is preferentially orientated in the (001) plane. The lattice constant of Ti is 0.295 nm, which is close to the lattice constant of the ZnO (0.32 nm) and the AlN (0.31 nm) used for the piezoelectric thin-film 5. That is, a preferable consistency of lattice constant is obtained.

Because the Ti of the base electrodes 4a and 6a is preferentially oriented in the (001) plane, the crystallinity of the lower electrode 4b is improved and the crystallinity of the piezoelectric thin-film 5 is also improved. As a result, the resonance characteristics are improved.

Instead of Ti, Cr, or NiCr may be used for the base electrode 4a under the lower electrode 4b. In order to minimize the difference between the lattice constants, NiCr, whose lattice constant is 0.25 nm, may preferably be used. In particular in order minimize the difference in the lattice constants, it is preferable that the NiCr is preferentially oriented in the (111) plane.

Accordingly, as in the case where Ti is used, the crystallinity of the lower electrode 4b is improved, the crystallinity of the piezoelectric thin-film 5 is also improved, and thus the resonance characteristic is improved. Also, by improving the crystallinity of the lower electrode 4b, the resistance to electrical power of the piezoelectric thin-film resonator is improved.

The base electrode 6a under the upper electrode 6b not only serves as an adhesive layer for the upper electrode 6b but also has an orientation layer. Therefore, the crystallinity of the upper electrode 6b is improved and the resistance to electrical power of the piezoelectric thin-film resonator can be improved.

Figure 8:
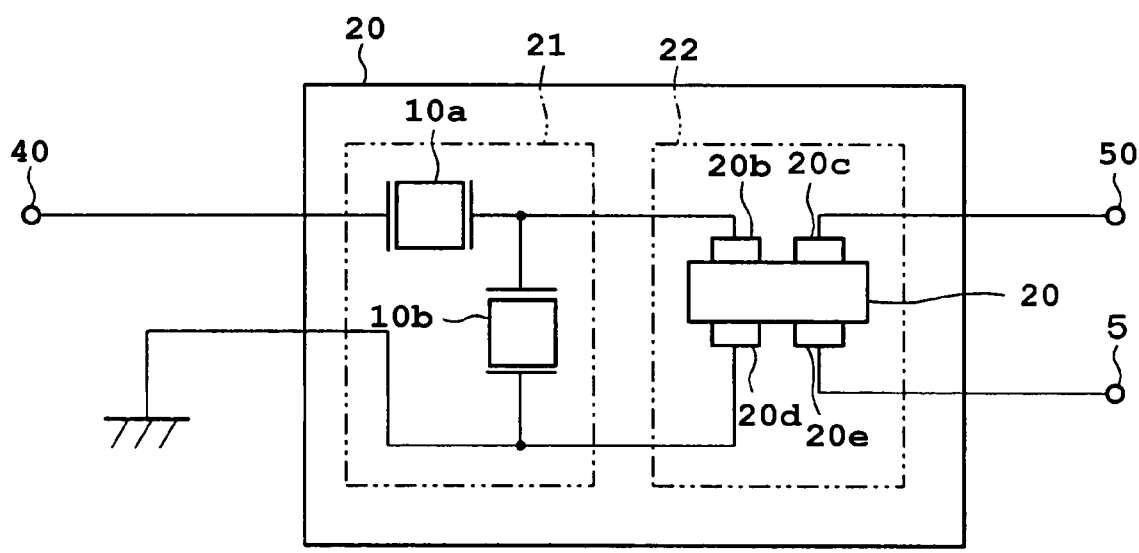
FIG. 8 is a circuit diagram of a piezoelectric filter according to a third preferred embodiment of the present invention.

As shown in FIG. 8, a piezoelectric filter according to a third preferred embodiment has a ladder filter 21 and a double-mode filter (balanced-to-unbalanced transforming unit) 22 connected to the ladder filter 21 on a supporting substrate 20. The ladder filter 21 has a first piezoelectric thin-film resonator 10a and a second piezoelectric thin-film resonator 10b connected in a ladder configuration.

A first terminal of the first piezoelectric thin-film resonator 10a is connected to an unbalanced terminal 40 in series, and the second piezoelectric thin-film resonator 10b is connected between a second terminal of the first piezoelectric thin-film resonator 10a and a ground terminal in parallel. A plurality of L filters, each having the first piezoelectric thin-film resonator 10a and the second piezoelectric thin-film resonator 10b arranged in combination, connected in series may be used.

The anti-resonant frequency of the first piezoelectric thin-film resonator 10a is set to be substantially the same as a resonant frequency of the second piezoelectric thin-film resonator 10b, and the resonant frequency of the second piezoelectric thin-film resonator 10b, which serves as a parallel resonator, is lower than a resonant frequency of the first piezoelectric thin-film resonator 10a, which serves as a series resonator. Preferably, in the ladder piezoelectric filter, the stiffness of the electrode of the piezoelectric thin-film resonator 10b in a parallel side is desirably higher than the stiffness of the electrode of the piezoelectric thin-film resonator 10a in a series side. With this arrangement, the Q of the piezoelectric thin-film resonator 10 in the parallel side is improved, the insertion loss of the ladder piezoelectric filter is reduced, and shouldering is suppressed in a low-frequency side of the pass band. Because the electrode serves as an elastic member, the Q of the piezoelectric thin-film resonators 10a and 10b is improved.

This arrangement allows the ladder filter 21 to have a high selectivity with respect to a pass band defined between the anti-resonant frequency of the second piezoelectric thin-film resonator 10b and the resonant frequency of the first piezoelectric thin-film resonator 10a, where both frequencies correspond to individual attenuation poles. Therefore, the ladder filter 21 has elimination bands including the attenuation poles at opposite sides of the pass band.

A method for manufacturing the first piezoelectric thin-film resonator 10a in the ladder filter 21 will now be described with reference to FIGS. 11A and 11B. This method of manufacturing is similar to the method discussed above with respect to FIG. 1. As shown in FIGS. 11A and 11B, silicon dioxide ($SiO_2$) layers 11 and 12 are formed on opposite surfaces of the supporting substrate 20 that is preferably composed of (100) silicon, respectively, by sputtering or thermal oxidation.

Then, a square window 12a having parallel sides in the (110) direction is formed in the $SiO_2$ layer 12 formed on the bottom face of the supporting substrate 20. The supporting substrate 20 is subjected to etching in a TMAH solution (tetramethylammonium hydroxide solution) at about 90° C. through the $SiO_2$ layer 12 functioning as a mask.

Because of the large orientation dependence in the etch rate for a TMAH solution, the etching forms (111)-planes 20a at an angle about 55° from the (100)-plane 20b. The (100)-plane 20b is the top face of the supporting substrate 20. Thus, an opening is formed through the supporting substrate 20 in the thickness direction thereof.

This etching process stops upon reaching the $SiO_2$ layer 11 formed on the top surface 20b of the supporting substrate 20. The etching process is completed at the $SiO_2$ layer 11 so that a smooth surface of the resonator is realized and so that the thickness of the entire resonator can be set more precisely.

An aluminum oxide ($Al_2O_3$) layer 13 is formed on a first surface, which opposes the supporting substrate 20, of the $SiO_2$ layer 11 by vacuum evaporation or sputtering so that a diaphragm composed of the $SiO_2$ layer 11 and the $Al_2O_3$ layer 13 is formed. The diaphragm faces the opening (hollow portion) of the supporting substrate 20 defined by the (111)-planes 20a.

The $SiO_2$ layer 11 has a positive temperature characteristic of resonant frequency and undergoes a compressive stress. The $Al_2O_3$ layer 13 has a negative temperature characteristic of resonant frequency and undergoes a tensile stress.

Then, on the diaphragm, a bottom electrode 14, a zinc oxide (ZnO) layer 15 serving as a piezoelectric thin layer, and a top electrode 16 are sequentially formed by vacuum evaporation or sputtering and by etching. Thus, the first piezoelectric thin-film resonator 10a is created. The ZnO layer 15 has a negative temperature characteristic of resonant frequency and undergoes a compressive stress.

The sum of the thicknesses of the $SiO_2$ layer 11, the $Al_2O_3$ layer 13, the bottom electrode 14, the ZnO layer 15, and the top electrode 16 can be set on the order of 3 µm, and the area of the diaphragm (vibrating portion) can be set on the order of 600 µm×600 µm.

The second piezoelectric thin-film resonator 10b, which is different from the first piezoelectric thin-film resonator 10a in terms of resonant frequency, can be produced in a similar manner. If the ZnO layer 15 is also used as the piezoelectric thin layer for the second piezoelectric thin-film resonator 10b, the resonant frequency of the second piezoelectric thin-film resonator 10b can be changed from the resonant frequency of the first piezoelectric thin-film resonator 10a by changing the sizes and thicknesses of the bottom and top electrodes.

Preferably, in the ladder filter 21, the thicknesses of the $SiO_2$ layer 11, the $Al_2O_3$ layer 13, and the ZnO layer 15 and the areas of the bottom electrode 14 and the top electrode 16 are set so that the vibrating mode is a second mode. Therefore, a temperature coefficient of resonant frequency (ppm/° C.) can be readily set at about zero in the ladder filter 21.

Preferably, in the ladder filter 21, the sum of the thicknesses of the $SiO_2$ layer 11 and the $Al_2O_3$ layer 13 and the thickness of the ZnO layer 15 are set so that the ladder filter 21 resonates at a half wavelength of a desired resonant frequency. Therefore, the vibrating mode of the ladder filter 21 is set to the second mode more reliably.

Preferably, in the ladder filter 21, the bottom electrode 14, the ZnO layer 15, and the top electrode 16 arranged so that the piezoelectric thin-film resonator is of an energy-trap type. Therefore, vibrating energy is prevented from leaking into the supporting substrate 20 along the diaphragm. Thus, the resonance has a high Q.

As described above, in the ladder filter 21, the $SiO_2$ layer 11 and the $Al_2O_3$ layer 13, which are an insulating (supporting) layer, are significantly thin. Therefore, the piezoelectric thin-film resonator is operable at radio frequencies of 100 MHz or more in a fundamental or a low order (e.g., second) overtone mode. Additionally, in the ladder filter 21, temperature characteristics and internal stresses of the layers are set to cancel each other out. Thus, the adverse effects of variations in temperature and internal stress are avoided.

The dimensions of the diaphragm of the piezoelectric thin-film resonator are as small as several hundreds of micrometers or less, and a process of manufacturing the piezoelectric thin-film resonator is compatible with that of a semiconductor integrated circuit. Therefore, the piezoelectric thin-film resonator can be mounted in the integrated circuit. Additionally, because the piezoelectric thin-film resonator does not require submicron patterning at several GHz, unlike a surface acoustic wave device (SAW device), manufacturing is facilitated and simplified.

Figure 9A:
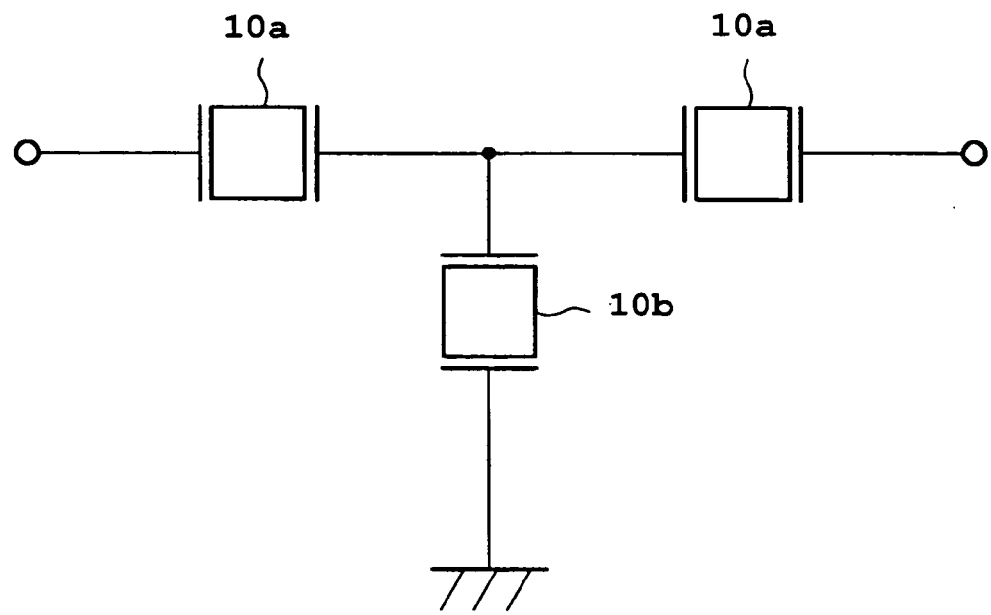
Figure 9B:
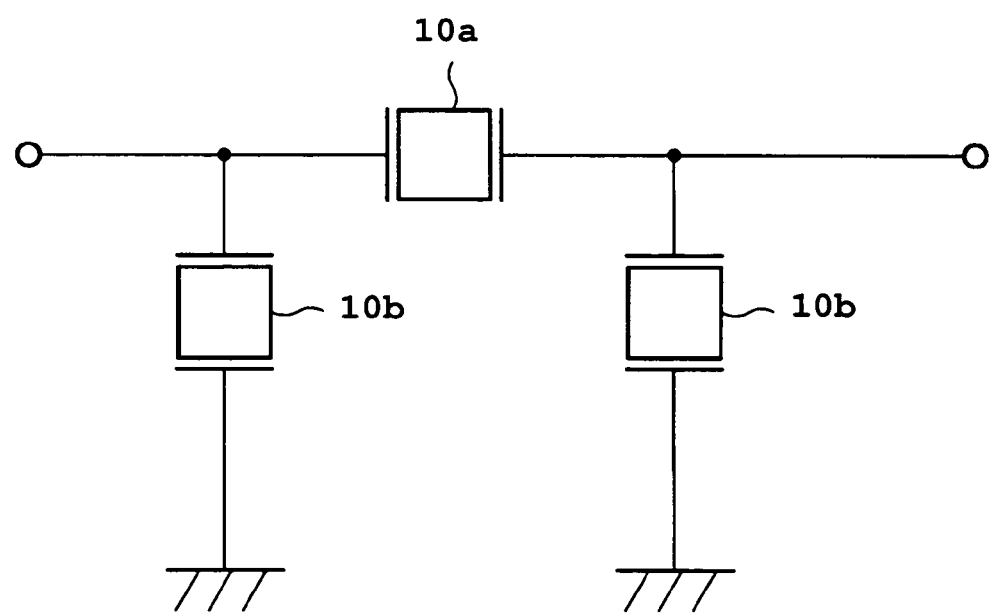

The L-type ladder filter 21 shown in FIG. 8 may be of a T type or n type, as illustrated in FIGS. 9A and 9B, or any modified example thereof.

The diaphragm of the ladder filter 21 faces the opening. It is preferred that the diaphragm faces gaseous matter, such as air, not solid matter, which degrades a Q of vibration. Therefore, as an alternative to the opening, the diaphragm may face a cavity formed in the supporting substrate 20 or a gap formed between the supporting substrate 20 and the diaphragm. The piezoelectric thin-film resonator may have a cantilever structure or an overhang structure.

The double-mode filter 22 will now be described.

Figure 12A:
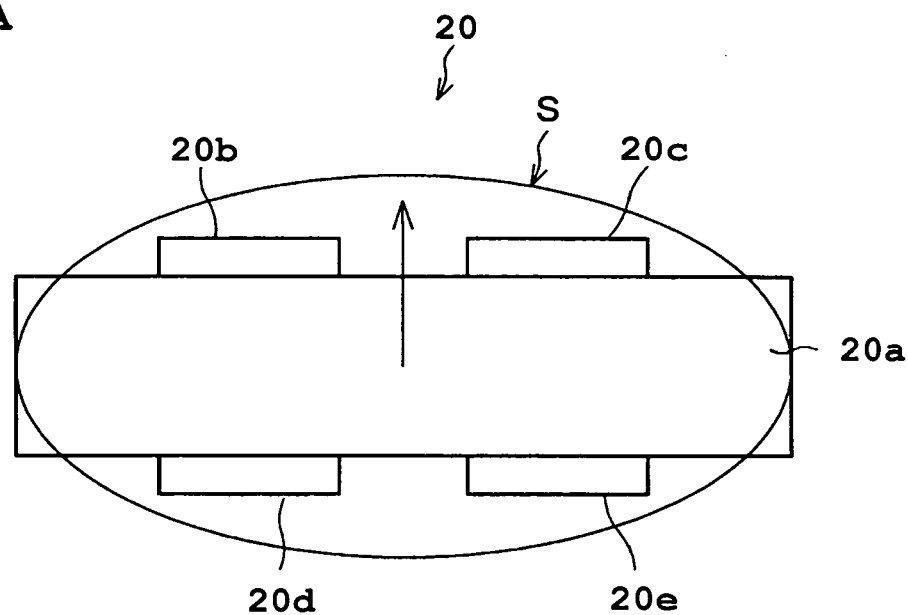
FIGS. 12A and 12B are sectional views of a vibrating portion of a double-mode filter for showing a symmetric mode (S mode) and an asymmetric mode (A mode), respectively.
Figure 12B:
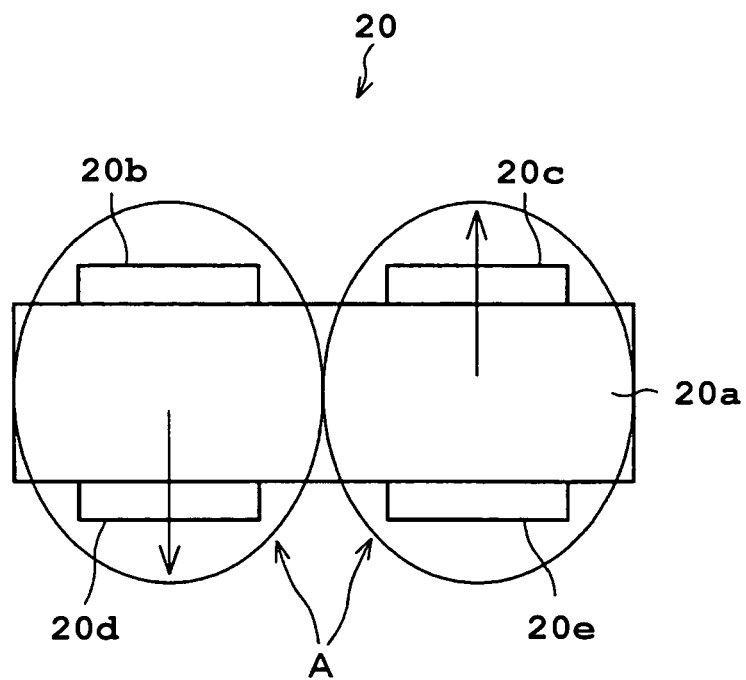
Figure 13:
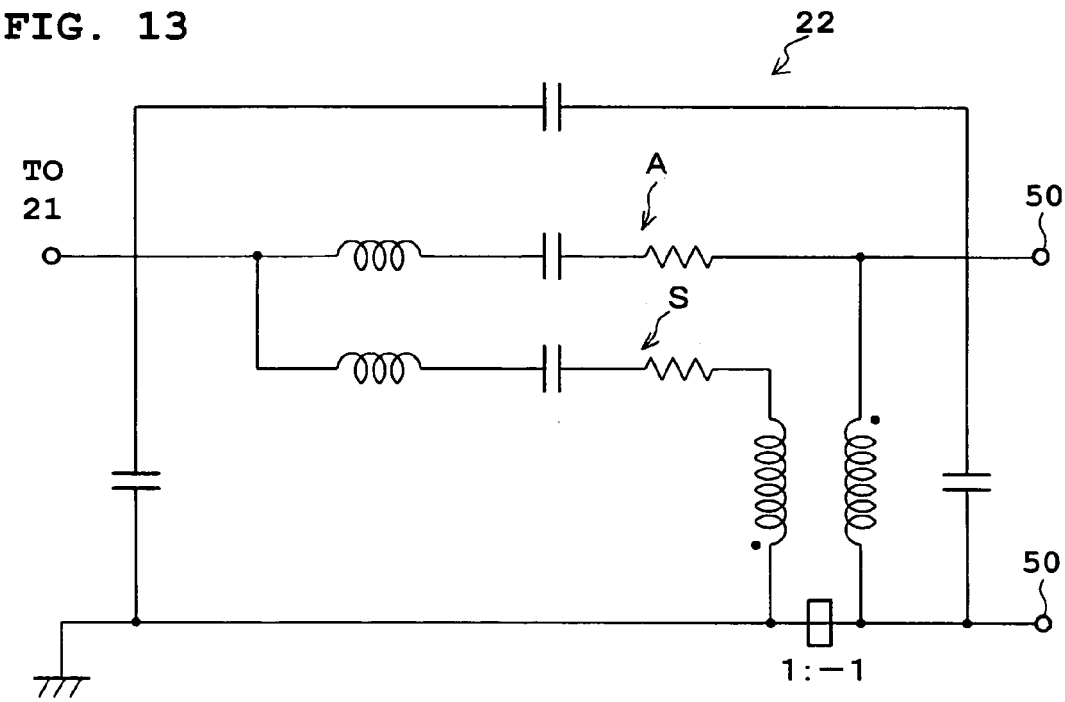
FIG. 13 shows an equivalent circuit of the double-mode filter of the piezoelectric filter according to a third preferred embodiment of the present invention.
Figure 14:
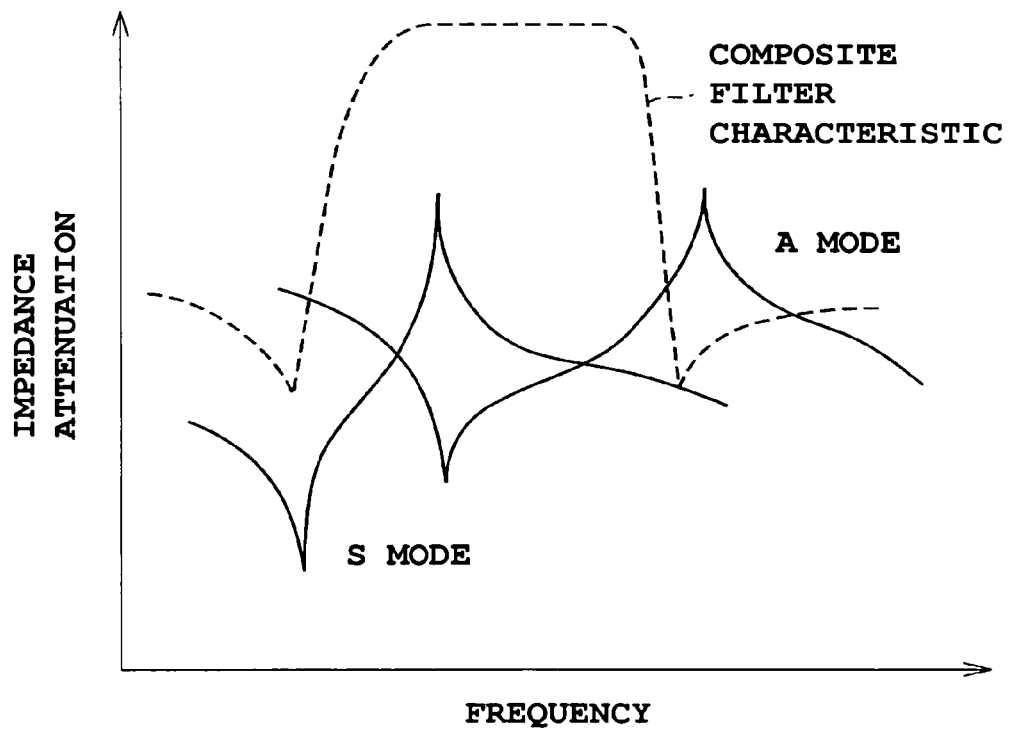
FIG. 14 is a graph showing the filter characteristics of the double-mode filter according to a third preferred embodiment of the present invention.

As shown in FIGS. 8, 12A, and 12B, facing electrodes 20b and 20d and facing electrodes 20c and 20e, which are composed of aluminum, are formed on opposite faces of the piezoelectric substrate 20a by vacuum evaporation or sputtering and by etching. The electrode 20b is connected to the second terminal of the first piezoelectric thin-film resonator 10a.

The piezoelectric substrate 20a and the ZnO layer 15 of the ladder filter 21 may be common or formed individually. Preferably, a common layer is used for the sake of simplification in manufacturing process and structure.

The electrodes 20b and 20c are strips and lie parallel to one another. The electrodes 20d and 20e are strips and lie parallel to one another.

The electrode 20d is connected to the ground terminal. Each of the electrodes 20c and 20e is connected to one of the balanced terminals 50. The facing electrodes 20b and 20d and the facing electrodes 20c and 20e lie adjacent to one another and are electrically insulated from each other.

Therefore, adjusting the sizes or the weights of the electrodes 20b, 20d, 20c, and 20e or the gap between these electrodes enables transforming unbalanced signals from the ladder filter 21 into balanced signals and externally outputting them, and in contrast, transforming balanced signals from the balanced terminals 50 into unbalanced signals and outputting them to the ladder filter 21.

For the double-mode filter 22, as shown in FIGS. 12A to 14, in the piezoelectric substrate 20a constituting a single resonator, two types of resonances modes, a symmetric mode (S mode) and an asymmetric mode (A mode), are excited so that the double-mode filter 22 has characteristics corresponding to a single section in the ladder filter 21 and undergoes thickness expansion vibration or thickness shear vibration.

In a piezoelectric filter according to this preferred embodiment, the terminal 40 of the ladder filter 21 is an unbalanced terminal and the terminals 50 of the double-mode filter 22 are balanced terminals. Each of the ladder filter 21 and the double-mode filter 22 includes the electrodes (Al), the piezoelectric thin layer (ZnO), and the diaphragm layer ($Al_2O_3$, $SiO_2$) and undergoes thickness expansion vibration. The materials are not limited to these. The electrode may be formed of gold (Au), molybdenum (Mo), tantalum (Ta), or niobium (Nb); the piezoelectric thin layer may be formed of aluminum nitride (AlN), lead zirconate titanate (PZT), or cadmium sulfide (CdS); and the diaphragm layer may be formed of silicon nitride ($SiN_x$).

The vibrating mode of each of the ladder filter 21 and the double-mode filter 22 may be a thickness shear vibration mode, an area expansion vibration mode, or a flexural vibration mode.

The advantages of the piezoelectric filter according to the third preferred embodiment are:

(i) The filter characteristics are determined by the ladder filter 21 and the double-mode filter 22. Therefore, the insertion loss of the piezoelectric filter of this preferred embodiment is smaller than the insertion loss of a filter comprising only a double-mode filter. (Because the ladder filter 21 does not propagate signals by the use of acoustic coupling, the insertion loss of the ladder filter 21 is smaller than the insertion loss of the double-mode filter.)

(ii) The piezoelectric filter of this preferred embodiment has balanced and unbalanced outputs. Therefore, the piezoelectric filter can be readily applied to a duplexer (DPX). In other words, a terminal of the ladder filter 21 can be connected to an antenna handling unbalanced signals, and a terminal of the double-mode filter 22 can be connected to an internal circuit handling balanced signals, such as an integrated circuit. Therefore, the piezoelectric filter can be applied to a duplexer without using an additional component.

Fourth Preferred Embodiment

Figure 15:
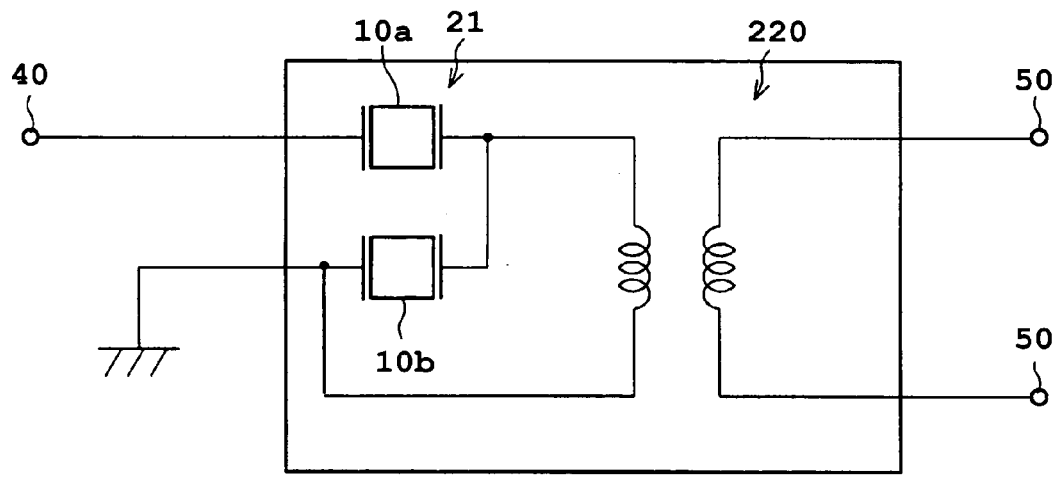
FIG. 15 is a circuit diagram of a piezoelectric filter according to a fourth preferred embodiment of the present invention.

As shown in FIG. 15, a piezoelectric filter according to a fourth preferred embodiment includes (1) the ladder filter 21, as shown in FIGS. 8, 11A, and 11B where the first piezoelectric thin-film resonator 10a and the second piezoelectric thin-film resonator 10b, are arranged in an L shape and connected in a ladder configuration, and (2) an induction coil (balanced-to-unbalanced transforming unit) 220. In the following preferred embodiments, the same components as in the third preferred embodiment have the same reference numerals, and the explanation thereof is omitted.

For the piezoelectric filter of the fourth preferred embodiment, the ladder filter 21 includes the unbalanced terminal 40, and the induction coil 220 includes the balanced terminals 50. It is not essential that the induction coil 220 be disposed on the same substrate as the ladder filter 21; the induction coil 220 may be formed on (built into) a package or a mounting substrate. Alternatively, induction coil components may be mounted.

In the piezoelectric filter of the fourth preferred embodiment, the filter characteristics are determined by the ladder filter 21. Therefore, the insertion loss of the piezoelectric filter of the present preferred embodiment is smaller than the insertion loss of a filter comprising only a double-mode filter.

Further, the piezoelectric filter includes the balanced terminals 50 and the unbalanced terminal 40, thus facilitating application to a duplexer. In other words, a terminal of the ladder filter 21 can be connected to an antenna, and a terminal of the double-mode filter 22 can be connected to an internal circuit, such as an integrated circuit. Therefore, the piezoelectric filter can be applied to an electronic component, such as a duplexer, without using an additional component.

Fifth Preferred Embodiment

Figure 16:
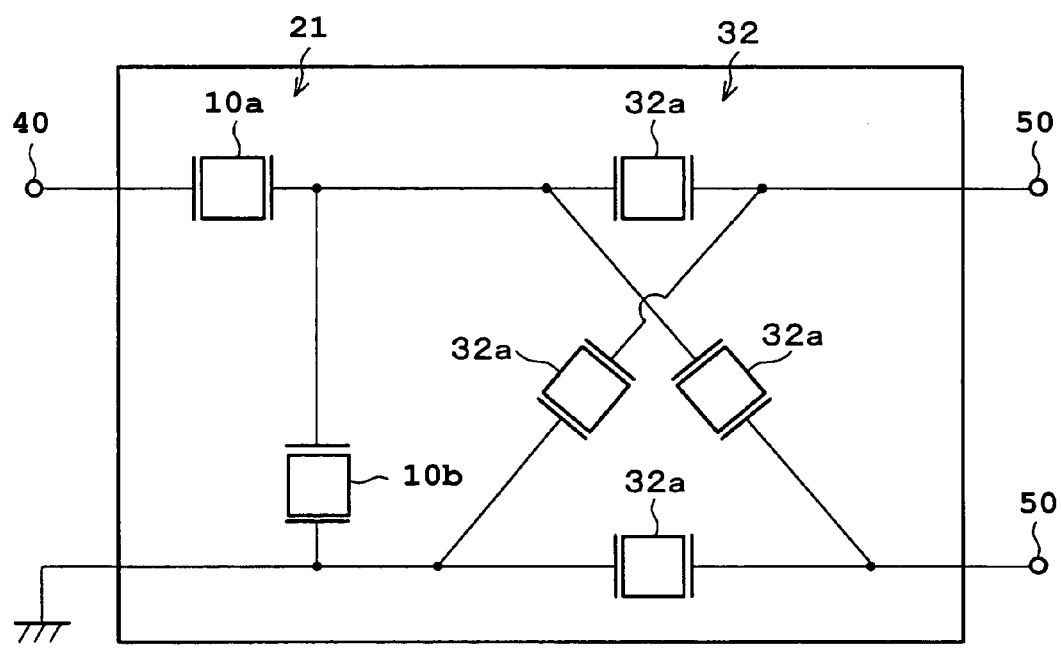
FIG. 16 is a circuit diagram of a piezoelectric filter according to a fifth preferred embodiment of the present invention.

As shown in FIG. 16, a piezoelectric filter according to a fifth preferred embodiment includes (1) the ladder filter 21, as shown in FIGS. 8, 11A, and 11B where the first piezoelectric thin-film resonator 10a and the second piezoelectric thin-film resonator 10b are arranged in a ladder configuration, and (2) a lattice filter (balanced-to-unbalanced transforming unit) 32 including a plurality of piezoelectric thin-film resonators 32a arranged in a lattice configuration. Each of the piezoelectric thin-film resonators 32a is similar to the first piezoelectric thin-film resonator 10a shown in FIG. 2. Therefore, in the piezoelectric filter of this preferred embodiment, the ladder filter 21 has the unbalanced terminal 40 and the lattice filter 32 has the balanced terminals 50.

In the piezoelectric filter of this preferred embodiment, the filter characteristics are determined by the ladder filter 21 and the lattice filter 32. Therefore, the insertion loss of the piezoelectric filter of the present preferred embodiment is smaller than the insertion loss of a filter comprising only a double-mode filter.

Moreover, the piezoelectric filter has the balanced terminals 50 and the unbalanced terminal 40, thus facilitating application to a duplexer. In other words, a terminal of the ladder filter 21 can be connected to an antenna, and a terminal of the lattice filter 32 can be connected to an internal circuit, such as an integrated circuit. Therefore, the piezoelectric filter can be applied to an electronic component, such as a duplexer, without using an additional component.

Sixth Preferred Embodiment

Figure 17:
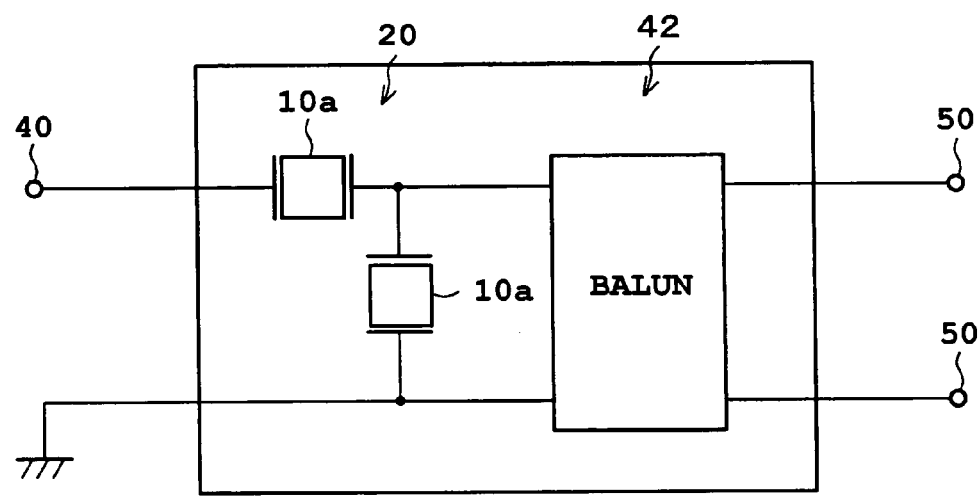
FIG. 17 is a circuit diagram of a piezoelectric filter according to a sixth preferred embodiment of the present invention.
Figure 18A:
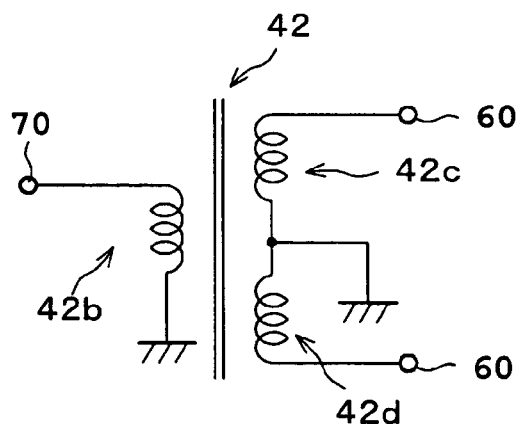
FIG. 18A illustrates an equivalent circuit of a balun of the piezoelectric filter.
Figure 18B:
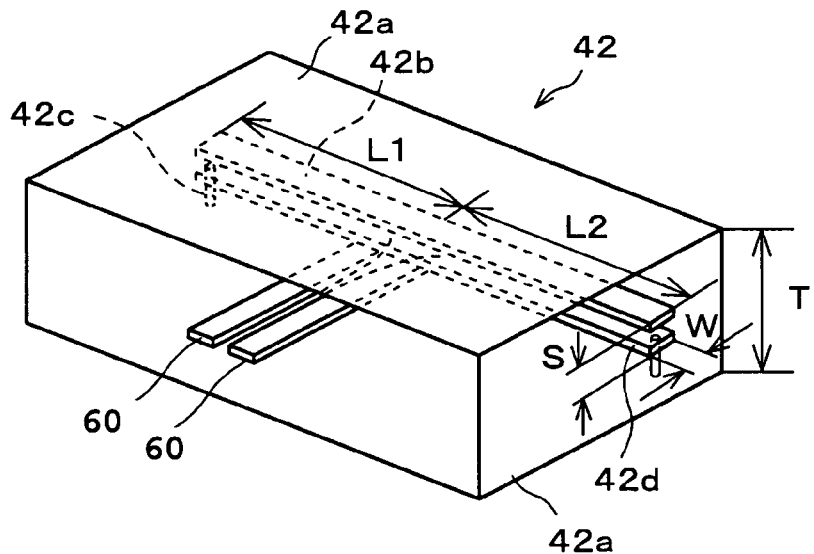
FIG. 18B is a perspective view of a balun of the piezoelectric filter.
Figure 18C:
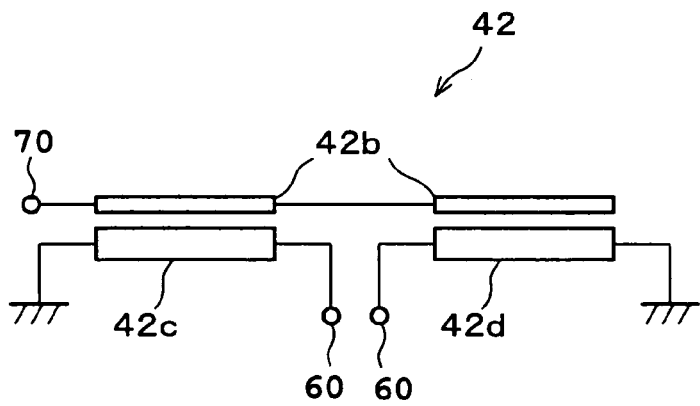
FIG. 18C schematically illustrates the structure of a balun of the piezoelectric filter.

As shown in FIG. 17, a piezoelectric filter according to a sixth preferred embodiment includes (1) the ladder filter 21, as shown in FIG. 16, and (2) a balun (balanced-to-unbalanced transforming unit) 42. The balun 42 may be, for example, a multilayer ceramic balun, as shown in FIGS. 18B and 18C.

The balun 42 includes GNDs 42a facing parallel to each other with a gap T therebetween and includes strip lines 42b, 42c, and 42d arranged between the GNDs 42a. The strip line 42b is connected to an unbalanced side and is electrically insulated from the GNDs 42a.

The strip lines 42c and 42d are arranged in line and lie parallel to the strip line 42b with a gap S therebetween. The strip lines 42c and 42d are electrically connected to one of the GNDs 42a via a through-hole at opposite ends of the strip line 42b and have individual balanced terminals 60 extending from the center of the strip line 42b. The strip lines 42c and 42d are set to form a coupling line for one quarter-wavelength between the strip line 42b and the strip lines 42c and 42d.

The operating principles of the balun 42 are described with reference to an equivalent circuit shown in FIG. 18A. An unbalanced signal input to the strip line 42b, serving as a primary coil, is inducted to the strip lines 42c and 42d, serving as two secondary coils having the same winding numbers and facing in the reverse direction. A signal at one of the terminals 60 and a signal at the other of the terminals 60 are in opposite phase, and a potential difference between the terminals 60 is equal to the potential difference between the terminal 70 and the GND. In other words, an unbalanced signal input to the terminal 70 is output to the terminals 60 as a balanced signal.

In the piezoelectric filter of this preferred embodiment, the ladder filter 21 is connected to the unbalanced terminal 40, and the balun 42 is connected to the balanced terminals 50. It is not essential that the balun 42 be disposed on the same substrate as the ladder filter 21. The balun 42 may be formed on (built into) a package or a mounting substrate. Alternatively, a balun component may be mounted.

In the piezoelectric filter of this preferred embodiment, the filter characteristics are determined by the ladder filter 21. Therefore, the insertion loss of the piezoelectric filter of the present preferred embodiment is smaller than the insertion loss of a filter comprising only a double-mode filter.

Moreover, the piezoelectric filter has balanced and unbalanced outputs, thus facilitating application to a duplexer. In other words, a terminal of the ladder filter 21 can be connected to an antenna, and a terminal of the balun 42 can connected to an internal circuit, such as an integrated circuit. Therefore, the piezoelectric filter can be applied to an electronic component, such as a duplexer, without using an additional component.

Seventh Preferred Embodiment

Figure 10:
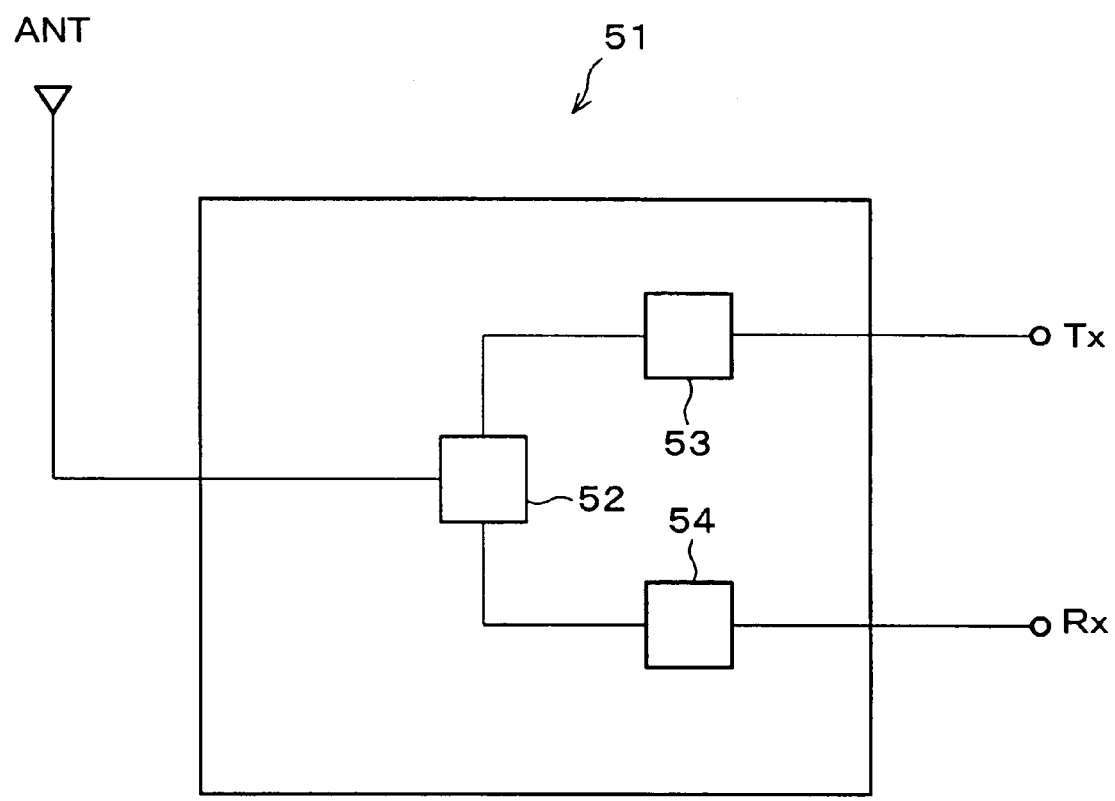
FIG. 10 is a circuit diagram of a duplexer serving as an electronic component including the piezoelectric filter.

As shown in FIG. 10, a duplexer according to the seventh preferred embodiment of the present invention includes a matching circuit 52 connected to an antenna (ANT), a transmitting filter 53 disposed between the matching circuit 52 and a transmitting terminal (Tx), and a receiving filter 54 disposed between the matching circuit 52 and a receiving terminal (Rx). The transmitting filter 53 and the receiving filter 54 are set to have different pass bands.

Preferably, at least one of the transmitting filter 53 and the receiving filter 54 is one of piezoelectric filters of the first and the third preferred embodiments. This piezoelectric filter may be replaced with that of any one of the fourth, fifth, and sixth preferred embodiments. Using the piezoelectric filter as at least one of the transmitting filter 53 and the receiving filter 54 allows the duplexer to have good and steep filter characteristics. The term "steep" means that a frequency width required for dropping attenuation to a predetermined amount from the top and bottom ends of the pass band is small.

The piezoelectric filter according to this preferred embodiment includes the balanced and unbalanced terminals, thus facilitating application to a duplexer. In other words, a terminal of the ladder filter 21 can be connected to an antenna, and a terminal functioning to transform unbalanced output to balanced output can be connected to an internal circuit, such as an integrated circuit. Therefore, the piezoelectric filter can be applied to a duplexer without using an additional component.

Eighth Preferred Embodiment

Figure 19:
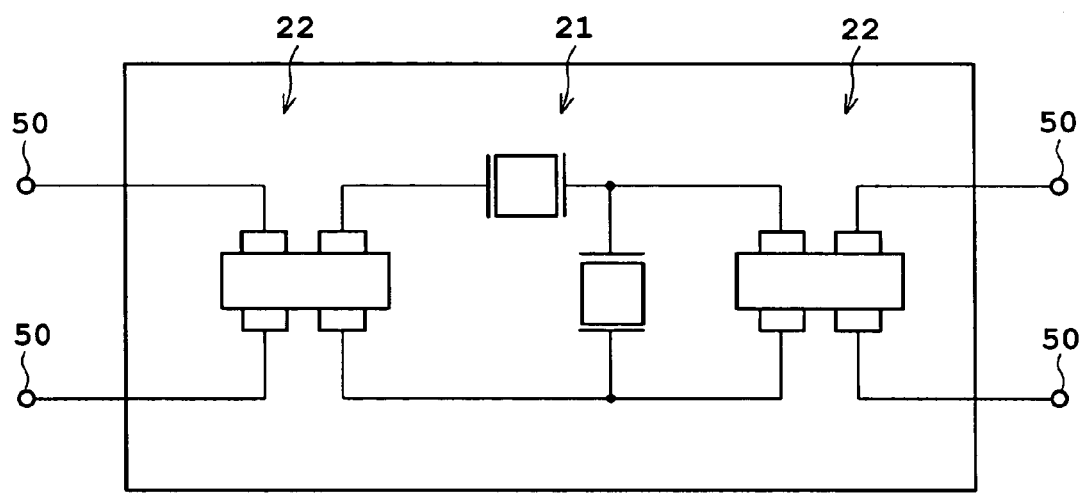
FIG. 19 is a circuit diagram of a piezoelectric filter according to an eighth preferred embodiment.

As shown in FIG. 19, a piezoelectric filter according to an eighth preferred embodiment includes (1) the ladder filter 21 and (2) a structure functioning to transform unbalanced output to balanced output. Input and output terminals are balanced terminals. In this preferred embodiment, the structure includes two double-mode filters 22. The structure may include the induction coils 220, the lattice filters 32, the baluns 42, or a combination including at least two of these devices.

The piezoelectric filter of this preferred embodiment has the balanced terminals as the input and output terminals, and therefore, can be used in an application requiring balanced terminals as input and output terminals.

The balanced-to-unbalanced transforming unit may be a transversal surface-acoustic-wave filter.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A piezoelectric filter comprising:
   a substrate; and
   a plurality of piezoelectric resonators; wherein
   at least one of the plurality of piezoelectric resonators includes:
      a piezoelectric thin-film disposed on the substrate;
      a first electrode and a second electrode facing each other with the piezoelectric thin-film therebetween; and
      a base electrode provided under each of the first and second electrodes;
   a stiffness of at least one of the first and second electrodes is higher than a stiffness of the piezoelectric thin-film;
   each of the base electrodes has an adhesion strength that is greater than an adhesion strength of the first and second electrodes;
   at least one of the piezoelectric resonators includes an insulating layer disposed on a surface thereof; and
   the insulating layer includes a plurality of thin insulating sublayers having different temperature coefficients.

2. The piezoelectric filter according to claim 1, further including a balanced-to-unbalanced transforming unit selected from the group consisting of a double-mode filter, an induction coil, a lattice filter, a balun, and a transversal surface-acoustic-wave filter.

3. The piezoelectric filter according to claim 1, wherein a vibrating portion of the piezoelectric thin-film is disposed directly above a hollow portion and lies adjacent to the substrate.

4. The piezoelectric filter according to claim 3, wherein the hollow portion is one of an opening and a cavity in the substrate.

5. The piezoelectric filter according to claim 1, wherein the plurality of piezoelectric resonators is arranged in a ladder configuration.

6. The piezoelectric filter according to claim 1, wherein the plurality of piezoelectric resonators is arranged in a lattice configuration.

7. An electronic component including the piezoelectric filter according to claim 1.

8. The piezoelectric filter according to claim 1, further including a balanced-to-unbalanced transforming unit.

9. A piezoelectric filter comprising:
   a substrate; and
   a plurality of piezoelectric resonators; wherein
   at least one of the plurality of piezoelectric resonators includes:
   a piezoelectric thin-film disposed on the substrate; and
   a first electrode and a second electrode facing each other with the piezoelectric thin-film therebetween;
   a stiffness of at least one of the first and second electrodes is higher than a stiffness of the piezoelectric thin-film;
   a difference between a lattice constant of the piezoelectric thin-film in a direction vertical to a vibration direction of the at least one of the plurality of piezoelectric resonators and a lattice constant of a material of one of the first and second electrodes in said direction vertical to said vibration direction is about 5% or less;
   at least one of the piezoelectric resonators includes an insulating layer disposed on a surface thereof; and
   the insulating layer includes a plurality of thin insulating sublayers having different temperature coefficients.

10. The piezoelectric filter according to claim 9, further including a balanced-to-unbalanced transforming unit selected from the group consisting of a double-mode filter, an induction coil, a lattice filter, a balun, and a transversal surface-acoustic-wave filter.

11. The piezoelectric filter according to claim 9, wherein a vibrating portion of the piezoelectric thin-film is disposed directly above a hollow portion and lies adjacent to the substrate.

12. The piezoelectric filter according to claim 11, wherein the hollow portion is one of an opening and a cavity in the substrate.

13. The piezoelectric filter according to claim 9, wherein the plurality of piezoelectric resonators is arranged in a ladder configuration.

14. The piezoelectric filter according to claim 9, wherein the plurality of piezoelectric resonators is arranged in a lattice configuration.

15. An electronic component including the piezoelectric filter according to claim 9.

16. The piezoelectric filter according to claim 9, further including a balanced-to-unbalanced transforming unit.

17. A piezoelectric filter comprising:
   a substrate; and
   a plurality of piezoelectric resonators; wherein
   at least one of the plurality of piezoelectric resonators includes:
   a piezoelectric thin-film disposed on the substrate;
   a first electrode and a second electrode facing each other with the piezoelectric thin-film therebetween; and
   a base electrode provided under each of the first and second electrodes;
   a stiffness of at least one of the first and second electrodes is higher than a stiffness of the piezoelectric thin-film;
   each of the base electrodes has an adhesion strencith that is greater than an adhesion strength of the first and second electrodes;
   at least one of the piezoelectric resonators includes an insulating layer disposed on a surface thereof; and
   the insulating layer comprises a plurality of structures whose internal stresses are different.

18. The piezoelectric filter according to claim 17, further including a balanced-to-unbalanced transforming unit selected from the group consisting of a double-mode filter, an induction coil, a lattice filter, a balun, and a transversal surface-acoustic-wave filter.

19. The piezoelectric filter according to claim 17, wherein a vibrating portion of the piezoelectric thin-film is disposed directly above a hollow portion and lies adjacent to the substrate.

20. The piezoelectric filter according to claim 19, wherein the hollow portion is one of an opening and a cavity in the substrate.

21. The piezoelectric filter according to claim 17, wherein the plurality of piezoelectric resonators is arranged in a ladder configuration.

22. The piezoelectric filter according to claim 17, wherein the plurality of piezoelectric resonators is arranged in a lattice configuration.

23. An electronic component including the piezoelectric filter according to claim 17.

24. The piezoelectric filter according to claim 17, further including a balanced-to-unbalanced transforming unit.

25. A piezoelectric filter comprising:
   a substrate: and
   a plurality of piezoelectric resonators; wherein
   at least one of the plurality of piezoelectric resonators includes:
   a piezoelectric thin-film disposed on the substrate; and
   a first electrode and a second electrode facing each other with the piezoelectric thin-film therebetween;
   a stiffness of at least one of the first and second electrodes is higher than a stiffness of the piezoelectric thin-film;
   a difference between a lattice constant of the piezoelectric thin-film in a direction vertical to a vibration direction of the at least one of the plurality of piezoelectric resonators and a lattice constant of a material of one of the first and second electrodes in said direction vertical to said vibration direction is about 5% or less;
   at least one of the piezoelectric resonators includes an insulating layer disposed on a surface thereof; and
   the insulating layer comprises a plurality of structures whose internal stresses are different.

26. The piezoelectric filter according to claim 25, further including a balanced-to-unbalanced transforming unit selected from the group consisting of a double-mode filter, an induction coil, a lattice filter, a balun, and a transversal surface-acoustic-wave filter.

27. The piezoelectric filter according to claim 25, wherein a vibrating portion of the piezoelectric thin-film is disposed directly above a hollow portion and lies adjacent to the substrate.

28. The piezoelectric filter according to claim 27, wherein the hollow portion is one of an opening and a cavity in the substrate.

29. The piezoelectric filter according to claim 25, wherein the plurality of piezoelectric resonators is arranged in a ladder configuration.

30. The piezoelectric filter according to claim 25, wherein the plurality of piezoelectric resonators is arranged in a lattice configuration.

31. An electronic component including the piezoelectric filter according to claim 25.

32. The piezoelectric filter according to claim 25, further including a balanced-to-unbalanced transforming unit.

* * * * *